United States Patent
Matsuno

(10) Patent No.: US 7,373,131 B2
(45) Date of Patent: May 13, 2008

(54) SIGNAL PROCESSING METHOD AND SIGNAL PROCESSING APPARATUS

(75) Inventor: Noriaki Matsuno, Tokyo (JP)

(73) Assignee: NEC Corporation (JP)

( * ) Notice: Subject to any disclaimer, the term of this patent is extended or adjusted under 35 U.S.C. 154(b) by 764 days.

(21) Appl. No.: 10/504,742

(22) PCT Filed: Feb. 21, 2003

(86) PCT No.: PCT/JP03/01955

§ 371 (c)(1),
(2), (4) Date: Aug. 16, 2004

(87) PCT Pub. No.: WO03/079539

PCT Pub. Date: Sep. 25, 2003

(65) Prior Publication Data

US 2005/0147184 A1    Jul. 7, 2005

(30) Foreign Application Priority Data

Mar. 20, 2002 (JP) ............................. 2002-078855

(51) Int. Cl.
*H04B 1/10* (2006.01)
(52) U.S. Cl. ...................................... 455/302; 455/285
(58) Field of Classification Search ................ 455/285, 455/302, 296, 303, 304, 306, 326
See application file for complete search history.

(56) References Cited

U.S. PATENT DOCUMENTS 4,864,643 A * 9/1989 French et al. ................ 455/302
6,081,697 A * 6/2000 Haartsen ...................... 455/109

FOREIGN PATENT DOCUMENTS

| JP | 08-130416 | 5/1996 |
| JP | 2000-223956 | 8/2000 |
| JP | 2001-513952 | 9/2001 |
| JP | 2001-284968 | 10/2001 |

* cited by examiner

*Primary Examiner*—Lee Nguyen
(74) *Attorney, Agent, or Firm*—Hayes Soloway P.C.

(57) ABSTRACT

A signal input into an input terminal 1 is input into mixers 2, 4, and down-converted with local signals having a phase difference of 90 degrees, respectively, whereby an I-signal and a Q-signal are obtained. An output signal from the mixer 4 is delayed 90 degrees in phase by a phase shifter 6. An adder 7 outputs a sum signal of the I-signal and the Q-signal, and a subtracter 8 outputs a subtracted signal between the I-signal and the Q-signal. The sum signal and the subtracted signal are input into band pass filters 9, 10, in which signals in undesired frequency band are cut, then converted into digital signals by AD converters 11, 12 and input into a signal processor 13. In the signal processor 13, a correlation signal of the sum signal and the subtracted signal is formed, and an image signal included in the sum signal is removed using the correlation signal and the subtracted signal.

49 Claims, 21 Drawing Sheets

SIGNAL PROCESSING METHOD AND SIGNAL PROCESSING APPARATUS

BACKGROUND OF THE INVENTION

1. Technical Field

The present invention relates to signal processing devices such as image rejection mixer circuits which remove components of image signals generated when high frequency signals and local signals are mixed and down-converted into intermediate frequency signals (IF signals), and to a signal processing method.

2. Related Art

In an IF receiver in which an IF (Intermediate Frequency) is set to be relatively low, an IF filter can be formed of a semiconductor element, which provides an advantage that an outside SAW (surface acoustic wave) filter is not required.

However, setting the IF frequency of an IF receiver to be low means to set the frequency of local signals used for converting the frequency of RF (radio frequency) signals relatively near the frequency of the RF signals. Therefore, the frequency of an undesired signal (hereinafter referred to as an image signal) positioned symmetrical to a desired signal with reference to the frequency of the local signal on the frequency axis comes close to the frequency of the desired signal, whereby it becomes difficult to remove the image signal prior to a down-conversion.

Thus, down-conversion mixers must be provided with such a function to down-convert only desired signals and to serve as image rejection mixers for suppressing image signals.

FIG. 16 is a schematic diagram showing the configuration of a Hartley-type image rejection mixer as a typical image rejection mixer according to conventional art. The Hartley-type image rejection mixer shown in FIG. 16 is described in the U.S. Pat. No. 1,666,206 and has been well known.

The image rejection mixer shown in FIG. 16 is provided with input terminals 1, 4, 5, mixers 2, 3, a phase shifter 6 as a phase delaying means, an adder (adding means) 7, and an output terminal 34. The mixer is so configured as to convert the frequency of RF signals input from the input terminal 1 and output IF signals from the output terminal 34.

The operation of the Hartley-type image rejection mixer shown in FIG. 16 will be described below. FIG. 17 is a chart showing an example of frequency distribution of an input signal input into the Hartley-type image rejection mixer shown in FIG. 16. In FIG. 17, the vertical axis shows the frequency of an input signal and the horizontal axis shows magnitude of an input signal. To simplify the explanation, the input signal is assumed to include only two desired signals 14, 15 with frequency of $\pm\omega_1$ respectively, and two image signals 16, 17 with frequency of $\pm\omega_2$ respectively. Note that the frequency $\omega_1$ of the desired signals 14, the frequency $\omega_2$ of the image signal 16 and the frequency $\omega_{LD}$ of the local signal have a relationship of $(\omega_1+\omega_2)/2=\omega_{LD}$.

The RF signal input into the input terminal 1 shown in FIG. 16 is distributed to two branches. The RF signal in one branch is mixed with the local signal $\cos(\omega_{LD}*t)$ (a first periodic signal) input into the input terminal 4 in the mixer 2, and the RF signal in the other branch is mixed with the local signal $\sin(\omega_{LD}*t)$ (a second periodic signal) input into the input terminal 5 in the mixer 3. As a result, the mixer 2 outputs the down-converted signal as an I-signal, and mixer 3 outputs the down-converted signal as a Q-signal. Then, the Q-signal passes through the phase shifter so that the phase is delayed 90 degrees.

FIG. 18 shows the state of a down-conversion from the input signal into the I-signal. In FIG. 18, the corresponding relationships in the down-conversion of the desired signals are shown by the arrows of solid lines, and the corresponding relationships in the down-conversion of the image signals are shown by the arrows of dotted lines.

As shown in FIG. 18, in the mixer 2, the desired signals 14, 15 are down-converted, whereby down-converted desired signals 18, 19 are obtained. The frequencies of the down-converted desired signals 18, 19 are $\pm(\omega_1-\omega_{LD})$.

Further, in the mixer 2, the image signals 16, 17 are down-converted, whereby down-converted image signals 20, 21 are obtained. As obvious from FIG. 18, the down-converted desired signals 18, 19 and the down-converted image signals 21, 20 appear so as to be superimposed around frequencies of $\pm(\omega_1-\omega_{LD})$, respectively.

FIG. 19 shows a state of down-conversion from the input signal to the Q-signal. In FIG. 19, the corresponding relationships in the down-conversion of the desired signals are shown by the arrows of solid lines, and the corresponding relationships in the down-conversion of the image signals are shown by the arrows of dotted lines.

FIG. 19 shows the down-converted signals 22 to 25, which phases are delayed 90 degrees by the phase shifter 6.

In the mixer 3, the desired signals 14, 15 are down-converted, whereby down-converted desired signals 22, 23 are obtained, respectively. The frequencies of the down-converted desired signals 22, 23 are $\pm(\omega_1-\omega_{LD})$.

Further, in the mixer 3, the image signals 16, 17 are down-converted, whereby down-converted image signals 24, 25 are obtained, respectively. The down-converted desired signals 22, 23, which are obtained by down-converting the desired signals, and the down-converted image signals 25, 24, which are obtained by down-converting the image signal, appear around frequencies of $\pm(\omega_1-\omega_{LD})$, respectively. In this case, there is a phase difference of 90 degrees between the local signals ($\cos(\omega_{LD}*t)$, $\sin(\omega_{LD}*t)$; frequency $\omega_{LD}$) input into the mixers 2, 3. Further, due to the phase delay by the phase shifter (90-degree phase shifter) 6, in the case of the down-conversion shown in FIG. 19, the phases of the down-converted desired signals 22, 23 and those of the down-converted image signals are shifted 180 degrees.

In FIG. 19, the down-converted image signals 24, 25 shown downwardly represent the down-converted image signals with phase shifted of 180 degrees from the phases of the down-converted desired signals 22, 23.

When the down-converted I-signal and the Q-signal, shown in FIGS. 18 and 19, are added by the adder 7, each of the down-converted image signals 20 and 24, and 21 and 25 have the same amplitude with opposite polarity, as shown in FIGS. 18 and 19. Therefore, they offset each other, whereby only the down-converted desired signals 26, 27 with added amplitude of the down-converted desired signals 18, 19 and 22, 23 are obtained.

However, if there is gain deviation between the I-signal path from the mixer 2 to the adder 7 and the Q-signal path from the mixer 3 to the adder 7, the image signals do not offset completely at the adder output, whereby the image signals are not suppressed completely.

Further, if the 90-degree phase shift in the phase shifter 6 is not enough accurate, or if the phase difference between the signals with a frequency $\omega_{LD}(\cos(\omega_{LD}*t)$ and $\sin(\omega_{LD}*t))$ input into the mixer 2 and the mixer 3 is shifted from 90 degrees, the image signals are not suppressed completely as well.

FIG. 21 shows the aforementioned phenomenon where amplitude differences arise between the down-converted image signals 18 and 24, and 19 and 25. Therefore, they do not offset each other by addition. Consequently, the down-converted image signals 28 and 29, are output from the adder 7. Thus, the output from the adder 7 includes the down-converted image signals 28, 29 in addition to the down-converted desired signals 26, 27, and the down-converted image signals 28, 29 are superimposed on the down-converted desired signals 26, 27.

In equipments such as radio ones, it is required to support a case where the intensity of the image signal is larger than that of the desired signal. In such a case, for example, the image rejection ratio of more than 50 dB is required for an image rejection mixer.

However, when considering the process fluctuations of transistors and/or passive elements constituting the image rejection mixer, device characteristic drift due to the temperature variation, and so on, the typical image rejection ratio of conventional image rejection mixers is up to 30 dB.

One of a conventional technique to enhance the image rejection ratio of image rejection mixers is to add a filter for removing the image signal in front of a down-conversion mixer.

However, in IF receivers with relatively low IF frequency as described above, the frequency of a desired signal and the frequency of an image signal are close. Thereby, a loss of the desired signal caused by the aforementioned image rejection filter becomes large, resulting in performance degradation of the IF receivers.

Further, in such an image rejection filter, the frequency band of the desired signal is in the RF region, whereby it is impossible to integrate it in a semiconductor chip. This causes problems in miniaturization and cost reduction.

Another conventional technique is a feedback control method so as to increase the image suppression ratio, where the mixers 2, 3 and the phase shifter 6 are tunable depending on the external control.

However, this method has difficulties in in-situ monitoring of characteristics in each components compensating operation under temperature variation, and accuracy required in components for feedback control which are newly added. These causes yield drops, cost increase, and lack of stability.

As described above, in conventional image rejection mixers, there is a problem that undesired image signals remain due to the circuit nature during signal processing, which are superimposed on the desired signals.

Further, the conventional technique for suppressing the image signals (image leakage) causes such shortcomings that the performance of the equipment deteriorates, the cost becomes higher, power consumption increases, and the suppressing function does not fully work in some cases.

An object of the present invention is to provide a signal processing method and an equipment which is capable of suppressing undesired image signals, which are generated in the signal processing and are superimposed on desired signals.

DISCLOSURE OF THE INVENTION

In order to achieve the aforementioned object, a signal processing method according to the present invention comprises: a first frequency conversion step in which processing is performed to convert a frequency of an input signal with a first periodic signal having a predetermined frequency; a second frequency conversion step in which processing is performed to convert the frequency of the input signal with a second periodic signal having the predetermined frequency; a phase delaying step in which processing is performed to increase a phase difference between a signal converted in the first frequency conversion step and a signal converted in the second frequency conversion step by $\pi/2$; and an adding step in which processing is performed to output a sum signal of respective signals where the phase difference between the signals has been increased in the phase delaying step. The signal processing method has such a configuration to include: a subtracting step in which processing is performed to output a subtracted signal between the signal converted in the first frequency conversion step and the signal delayed in the phase delaying step; and a signal processing step in which processing is performed, assuming either one signal of the sum signal or the subtracted signal is a first signal and another signal is a second signal, to remove components of an image signal included in the second signal, using a correlation between the first signal and the second signal and using the first signal.

In the signal processing method of the present invention, processing is performed, assuming either one signal of the sum signal or the subtracted signal is a first signal and another signal is a second signal, to remove components of an image signal included in the second signal, using a correlation between the first signal and the second signal and using the first signal.

Therefore, according to the present invention, the residual components of the image signal included in the second signal can be removed completely, whereby it is possible to surely prevent such a phenomenon that undesired image signals are superimposed on the desired signals.

Further, a signal processing device for carrying out the signal processing method according to the present invention comprises: a first frequency conversion means for converting a frequency of an input signal with a first periodic signal having a predetermined frequency; a second frequency conversion means for converting a frequency of the input signal with a second periodic signal having the predetermined frequency; a phase delaying means for increasing a phase difference between the signal converted by the first frequency conversion means and the signal converted by the second frequency conversion means by $\pi/2$; and an adding means for outputting a sum signal of respective signals where the phase difference between signals has been increased by the phase delaying means. The signal processing device has such a configuration to include: a subtracting means for outputting a subtracted signal which is a difference between the signal converted by the first frequency conversion means and the signal delayed by the phase delaying means; and a signal processor which, assuming either one signal of the sum signal or the subtracted signal is a first signal and another signal is a second signal, removes components of an image signal included in the second signal using a correlation between the first signal and the second signal and using the first signal.

In the signal processing device of the present invention, the residual components of the image signal included in the second signal can be removed completely, whereby it is possible to surely prevent such a phenomenon that undesired image signals are superimposed on the desired signals.

Further, the signal processor can be configured to perform processing to obtain a first ratio which is a ratio of a low-frequency component of a correlation value between the first signal and the second signal to a low-frequency component of a square of the first signal, and to perform processing to calculate a subtracted value by subtracting a signal obtained by amplifying the first signal by the first ratio from the second signal. The signal processor may perform each of the processing after a phase of the first signal is delayed π/2.

Further, the signal processor may be configured to perform processing to calculate a first ratio which is a ratio of a low-frequency component of a correlation value between the first signal and the second signal to a low-frequency component of a square of the first signal, to amplify the first signal by the first ratio, to calculate a second ratio which is a ratio of a low-frequency component of a correlation between a signal obtained by delaying the first signal by π/2 and the second signal to a low-frequency component of a square of the first signal, to amplify the signal, obtained by delaying the first signal by π/2, by the second ration, and to perform processing to calculate a subtracted value by subtracting a sum signal of the signal amplified by the first ratio and the signal amplified by the second ratio from the second signal.

The first ratio may be a value calculated by subtracting a logarithmic value of a low-frequency component of a square of the first signal, from a logarithmic value of a low-frequency component of a multiplied signal of the first signal and the second signal. The second ratio may be a value calculated by subtracting a logarithmic vale of a low-frequency component of a square of the first signal, from a logarithmic value of a low-frequency component of a multiplied signal of the signal obtained by delaying π/2 the first signal and the second signal.

Further, the signal processor may have a switching means to choose to output the subtracted value or to output the second signal.

Further, the signal processor may be configured to include a first intensity detecting means for detecting an intensity of the first signal, and a second intensity detecting means for detecting an intensity of the second signal, and if a ratio of the intensity of the second signal to the intensity of the first signal exceeds a threshold value, the switching means chooses to output the second signal.

With this configuration, if the intensity of an image signal is not so strong, it is possible to prevent the receiving characteristics of a desired signal from being degraded due to an unnecessary image signal suppressing operation, by outputting a signal in the same way as a conventional device.

Further, the signal processing device of the present invention may be so configured to detect an error rate of a signal output from the signal processor, and to switch the switching means onto the side where the error rate decreases, or to change the threshold value.

BEST MODE FOR CARRYING OUT THE INVENTION

Next, an embodiment of the present invention will be explained in detail with reference to the drawings.

First Embodiment

Figure 1:
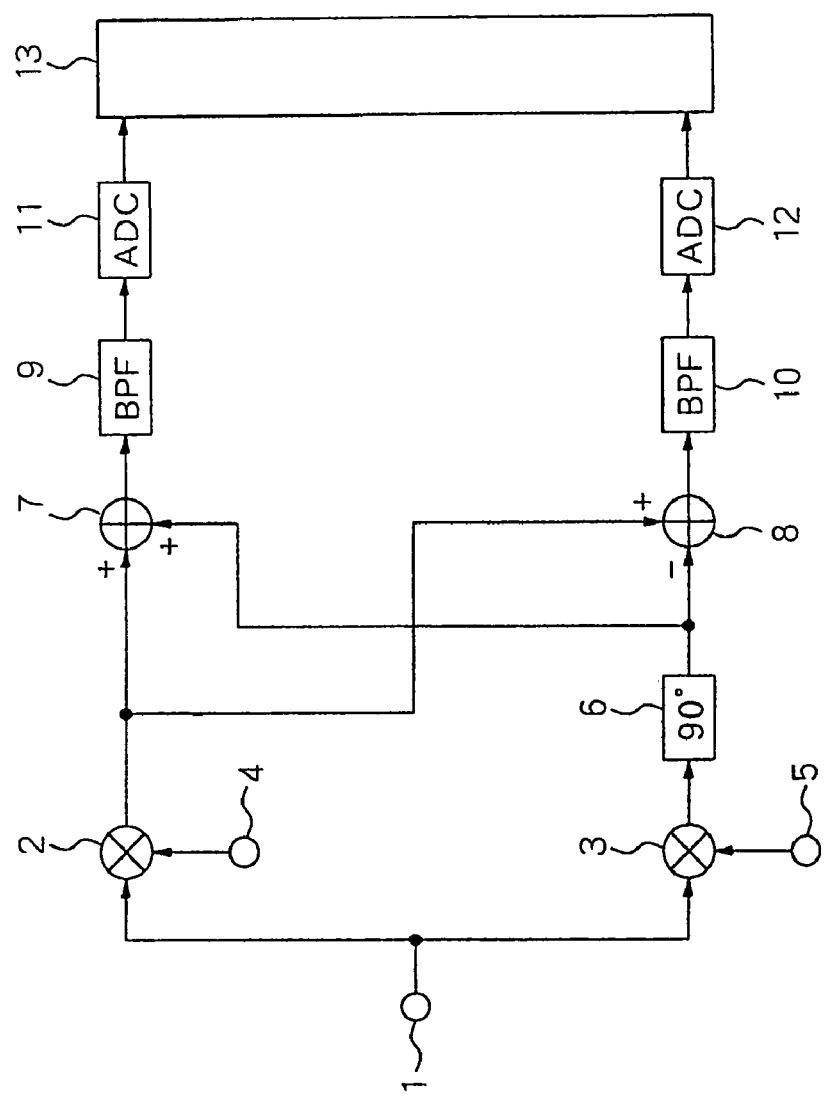
FIG. 1 is a schematic diagram showing the overall configuration of a signal processing device according to a first embodiment of the present invention.

First, a first embodiment of the present invention will be explained. FIG. 1 is a schematic diagram showing the overall configuration of a signal processing device according to the present embodiment.

As shown in FIG. 1, a signal processing device of the present embodiment comprises, a subtracter (subtracting means) 8, band pass filters (BPFs) 9, 10, AD converters 11, 12, and a signal processor 13. In the present embodiment, each of the band pass filters 9, 10 serves as a second filter and a first filter, respectively, and each of the AD converters 11, 12 serves as a second AD converter and a first AD converter, in addition to the configuration of a conventional image rejection mixer, respectively.

Figure 2:
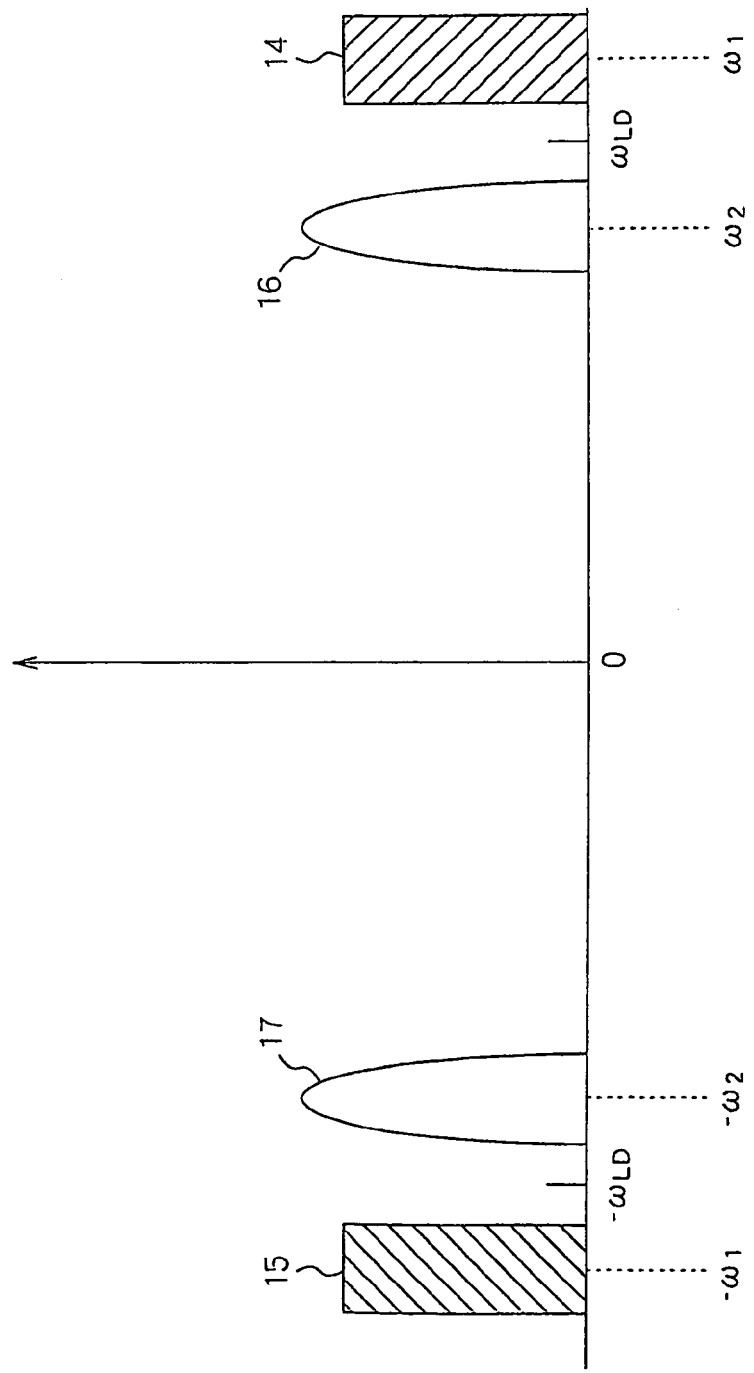
FIG. 2 is a chart showing a signal input into the signal processing device according to the first embodiment of the present invention.

In the present embodiment, outputs from the band pass filters 9, 10 are converted into digital signals by the AD converters, respectively. Therefore, in the signal processing device 13, digital signal processing is performed. Here, it is assumed that a signal shown in FIG. 2 is input into an input terminal 1. In order to simplify the explanation, the input signal shown in FIG. 2 is so configured as to only include desired signals 14, 15 with frequencies near $\pm\omega_1$ and image signals 16, 17 with frequencies near $\pm\omega_2$. In practical, however, the input signal includes undesired signals in different frequency bands from that of the signals shown in FIG. 2. Note that the frequency $\omega_1$ of the desired signal 14, the frequency $\omega_2$ of the image signal 16, and the frequency $\omega_{LD}$ of a local signal have a relationship of $(\omega_1+\omega_2)/2=\omega_{LD}$.

In FIG. 1, an RF signal input into the input terminal 1 distributed to two branches. The RF signal in one branch is mixed with a local signal $\cos(\omega_{LD}*t)$ input from the input terminal 4 in a mixer 2. The RF signal in the other branch is mixed with a local signal $\sin(\omega_{LD}*t)$ input from the input terminal 5 in a mixer 3.

In the present embodiment, the phase difference between the local signal $\cos(\omega_{LD}*t)$ input into the mixer 2 and the local signal $\sin(\omega_{LD}*t)$ input into the mixer 3 is 90 degrees ($\pi/2$). As a result, from the mixer 2, a down-converted signal is output as an I-signal, and from the mixer 3, a down-converted signal is output as a Q-signal. A phase shifter 6 delays the Q-signal by 90 degrees. Instead of using $\cos(\omega_{LD}*t)$ and $\sin(\omega_{LD}*t)$ as local signals, the local signal $\cos(\omega_{LD}*t)$ may input into the mixers 2 and 3 with use of a phase shifter which delays the phase of the RF signal input into the mixer 3 by $\pi/2$ compared to the phase of the RF signal input into the mixer 2.

The adder 7 adds the I-signal and the Q-signal. The band pass filter 9 cuts signals in undesired frequency bands from the added signal output from the adder 7. When the gain of the I-signal path and the gain of the Q-signal path are completely balanced, the phase difference between the frequencies of the local signals ($\cos(\omega_{LD}*t)$ and $\sin(\omega_{LD}*t)$) input into the mixers 2, 3, is completely 90 degrees, the 90-degree phase shift in the phase shifter 6 is operated ideally, and the parasitic phase rotation amount of the I-signal path and the Q-signal path are completely coincided, only desired signals appear in the output from the band pass filter 9.

In practice, however, the phase and the gain of the I-signal path and the Q-signal path are not completely balanced, and the phase shifting amount of the phase shifter 6 and the phase difference between the signals with a frequency of $\omega_{LD}$ are not completely 90 degrees. Thereby, the output signal from the band pass filter 9 is the sum of the desired signals and the attenuated image signals. Here, assuming that the desired signal component is X(t), the image signal component is Y(t), and the image suppression ratio of a path from the input terminal 1 to the band pass filter 9 is "a" (first ratio), the output signal from the band pass filter 9 (second signal) is expressed as follows:

$$X(t)+aY(t) \quad (1)$$

More strictly, the output signal formula for the output of the band pass filter 9 should include the coefficient due to the gain of the path from the input terminal 1 to the band pass filter 9 and a coefficient due to the phase rotation. These coefficients are omitted in the equation (1) for simplification.

Figure 3:
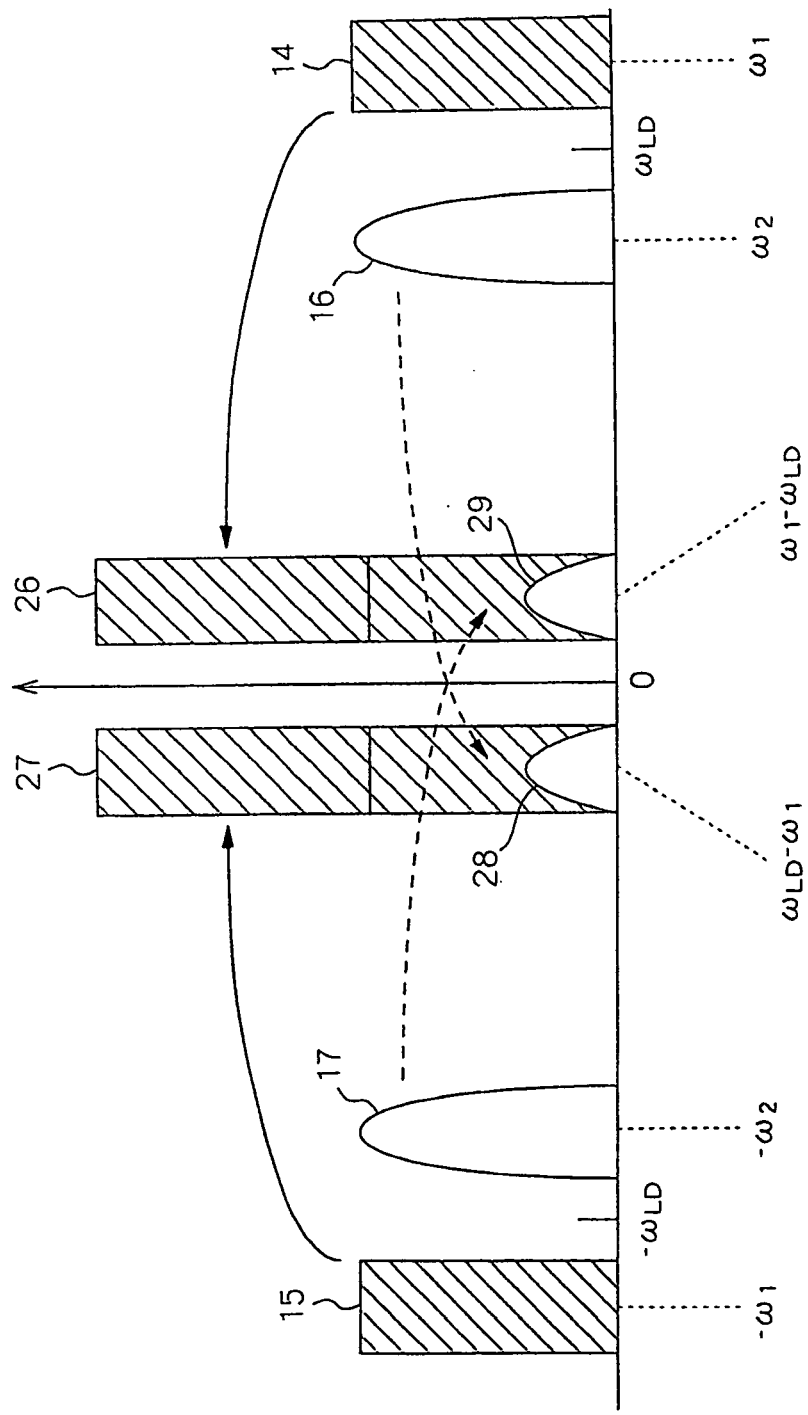
FIG. 3 is a chart showing an output signal output from a band pass filter 9.

FIG. 3 is a chart showing the output signal output from the band pass filter 9. In FIG. 3, the corresponding relationships in the down-conversions of the desired signals are shown by the arrows of solid lines, and the corresponding relationships in the down-conversions of the image signals are shown by the arrows of dotted lines.

As shown in FIG. 3, in the present embodiment, two desired signals 14, 15 are down-converted into two down-converted desired signals 26, 27 (X(t)), respectively, and the image signals 16, 17 are down-converted into down-converted image signals 28, 29 (aY(t)) which are not suppressed and remain, respectively.

The phase of the remained image signal aY(t) does not always coincide with that of the image signal Y(t). That is, "a" takes a complex number. The configuration of the signal path from the input terminal 1 to the output terminal of the band pass filter 9 is same as that of the Hartley-type image rejection mixer known as conventional art, as described above, whereby a typical value of the absolute value of "a" is about −30 dB.

On the other hand, the subtracter 8 subtracts the Q-signal from the I-signal and output the subtracted signal. The subtracted signal is input into a band pass filter 10 which has the same cut-off characteristics as the band pass filter 9. The band pass filter 10 cuts components in undesired frequent bands from the subtracted signal, to thereby output a signal in which components in undesired frequent bands have been cut.

When the gain of the I-signal path and the gain of the Q-signal path are completely balanced, the phase difference between the local signals ($\cos(\omega_{LD}*t)$ and $\sin(\omega_{LD}*t)$) input into the respective mixers 2, 3, is completely 90 degrees, the 90-degree phase shift in the phase shifter 6 is operated ideally, and the parasitic phase rotation amounts of the I-signal path and the Q-signal path are completely coincided, only desired signals appear in the output of the band pass filter 10.

In practice, however, the phase and the gain of the I-signal path and the Q-signal path are not completely balanced, and the 90-degree phase shift in the phase shifter 6 and the phase difference between the signals in the frequency $\omega_{LD}$ are not perfect. Thereby, the output signal from the band pass filter 10 is the sum of the desired signals and the attenuated image signals. Here, assuming that the desired signal is X(t), the image signal is Y(t), the image suppression ratio of the signal path from the input terminal 1 to the band pass filter 10 is "b" (second ratio), the output signal from the band pass filter 10 is expressed as follows:

$$Y(t)+bX(t) \quad (2)$$

Figure 4:
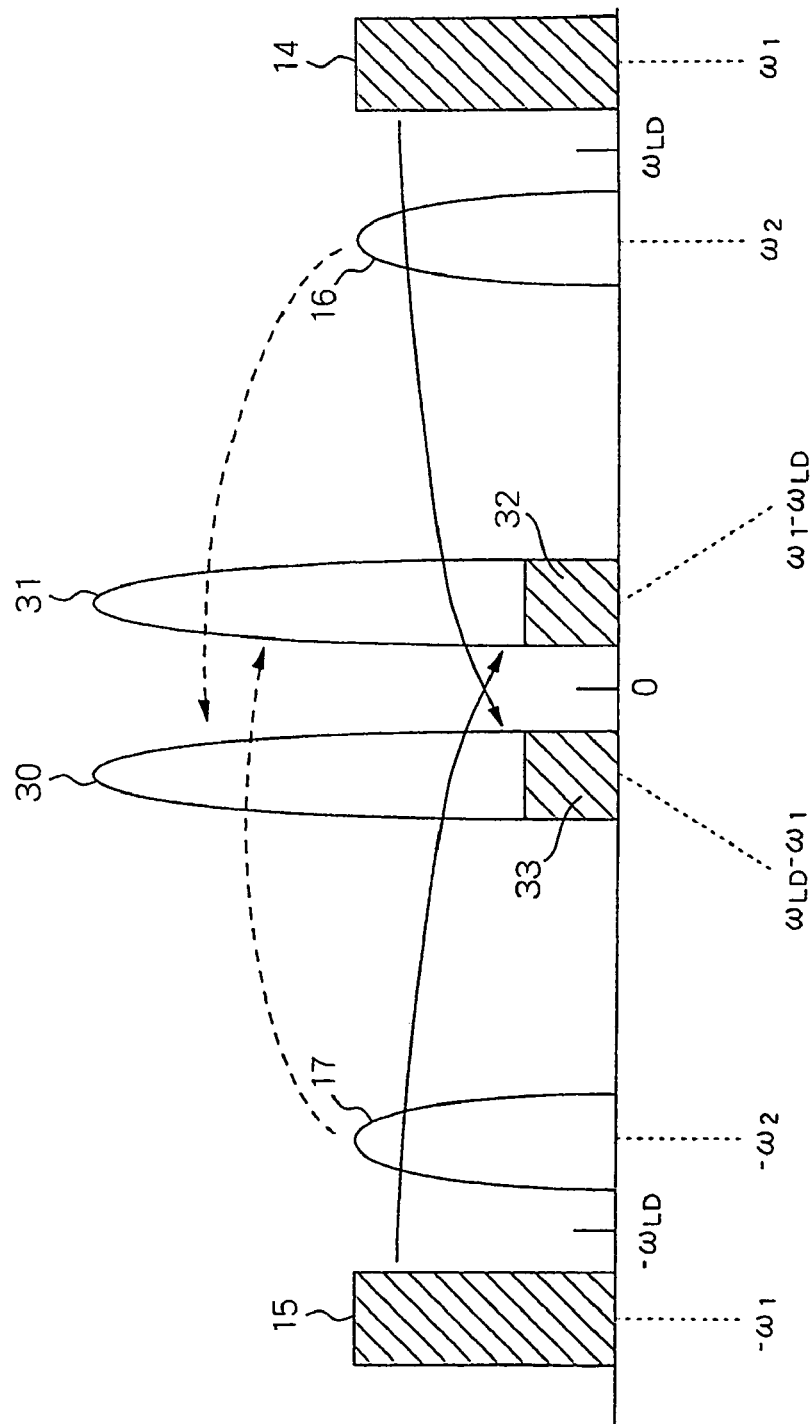
FIG. 4 is a chart showing an output signal output from a band pass filter 10.

FIG. 4 is a chart showing the output signal from the band pass filter 10. In FIG. 4, the corresponding relationships in the down-conversions of the desired signals are shown by the arrows of solid lines, and the corresponding relationships in the down-conversions of the image signals are shown by the arrows of dotted lines.

As shown in FIG. 4, the desired signals 14, 15 are down-converted into down-converted desired signals 33, 32 (bX(t)), respectively, and the image signals 16, 17 are down-converted into down-converted image signals 30, 31 (X(t)) which are not suppressed and remain, respectively.

The phases of the down-converted desired signals bY(t) remained do not always coincide with those of the original desired signals X(t). That is, "b" takes a complex number. The configuration of the signal path from the input terminal 1 to the band pass filter 10 is known as a variation of the Hartley-type image rejection mixer known as conventional art, whereby a typical value of the absolute value of "b" is also about −30 dB.

The output signal from the band pass filter 9 is converted into a digital signal by the AD converter 11. Similarly, the output signal from the band pass filter 10 is converted into a digital signal by the AD converter 12. The digital signals output from the AD converters 11, 12 are input into the signal processor 13.

Here, the second signal is the digital signal output from the AD converter 11, and the first signal is the digital signal output from the AD converter 12. The signal processor 13 removes components of the image signal included in the second signal using the correlation between the first signal and the second signal and using the first signal.

Figure 5:
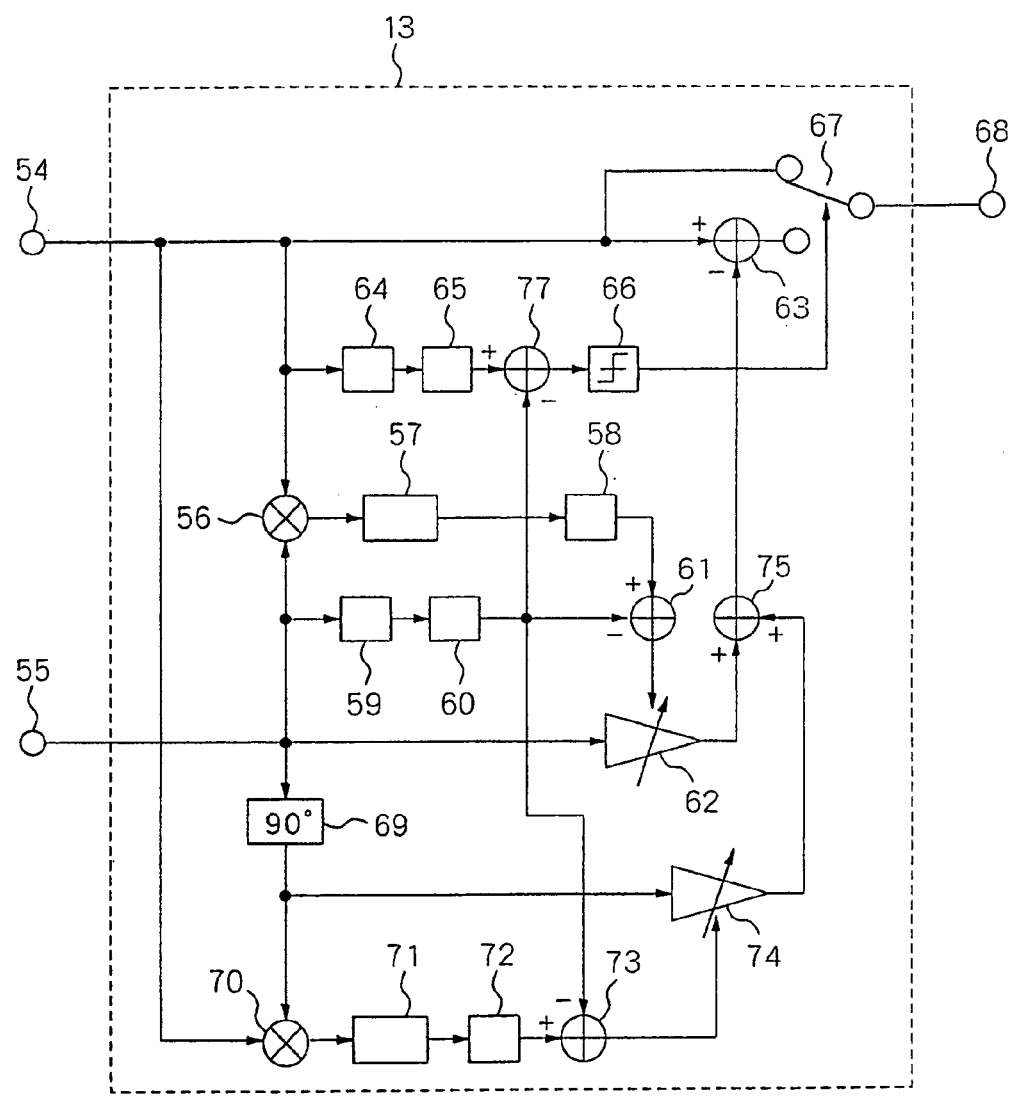
FIG. 5 is a schematic diagram showing an example of the specific configuration of a signal processor 13.

FIG. 5 is a schematic diagram showing an example of the specific configuration of the signal processor. All components of the signal processor 13 work to process digital signals. Here, the time average value of the square of the desired signal, $X(t)^2$, is shown as $|X|^2$, and the time average value of the square of the image signal, $Y(t)^2$, is shown as $|Y|^2$. The signal processor 13 has an input terminal 54 from which output signals from the AD converter 11 are input, and an input terminal 55 from which output signals from the AD converter 12 are input.

Although each of the input terminals 54, 55 is shown to have one signal line in FIG. 1, the input terminal 54, 55 are actually connected to multiple bit lines for parallel digital signals from the AD converter 11, 12.

First, considering a case where the absolute value of the image signal $|Y|$ is about 10 dB larger or more compared to the absolute value of the desired signal $|X|$.

A mean square calculation circuit 59 calculates the mean square value of the signal (first signal) output from the AD converter 12. Since the output value of the AD converter 12 is $Y(t)+bX(t)$, the result of squaring the output value by the mean square calculation circuit 59 is $Y(t)^2+2bX(t)Y(t)+\{bX(t)\}^2$. Generally, $X(t)$ and $Y(t)$ have no correlation, whereby the time average value of $2bX(t)Y(t)$ results in zero.

Accordingly, the output value of the mean square calculation circuit 59 is $|Y|^2+\{|b||X|\}^2$. Note that $|b|$ indicates the absolute value of "b". Here, taking into account the fact that the typical value of $|b|$ is about −30 dB, the output value of the mean square calculation circuit 59 is approximated to $|Y|^2$, if $|X|$ is in the equal level to $|Y|$ or less. Here, since it is considered the cases where $|Y|$ is about 10 dB larger or more compared to $|X|$, this approximation can be well established.

A mixer 56 multiplies the output signal from the AD converter 11 by the output signal from the AD converter 12, that is, multiplies the second signal by the first signal. Note that the mixer 56 is practically a digital mixer, that is, a multiplier. The output value of the mixer 56 is $\{X(t)+aY(t)\}*\{Y(t)+bX(t)\}=bX(t)^2+(1+ab)X(t)Y(t)+aY(t)^2$.

An average calculation circuit 57 calculates the time average vale of the output signal from the mixer 56. In general, $X(t)$ and $Y(t)$ have no correlation, whereby the time average value of $X(t)Y(t)$ results in zero. Further, it is assumed here that $|Y|$ is 10 dB larger than $|X|$ or more and it is considered that $|a|$ and $|b|$ is almost equal, whereby the output value of the average calculation circuit 57 is approximated to be $Re(a)|Y|^2$. Here, Re(a) indicates the real part of "a".

A mixer 70 multiplies a signal, which is obtained by delaying the phase of the output signal (first signal) from the AD converter 12 by 90 degrees by using the phase shifter 69 in the digital domain, and the output signal (second signal) from the AD converter 11.

The average calculation circuit 71 calculates the time average value of the output signal from the mixer 70. Taking into account the fact that $X(t)$ and $Y(t)$ have no correlation, $|a|$ and $|b|$ are almost equal, and $|Y|$ is assumed to be 10 dB larger than $|X|$ or more, the output value of the average calculation circuit 71 results in $Im(a)|Y|^2$. Here, Im(a) indicate the imaginary part of "a".

The output signal from each of the average calculation circuits 57, 59, 71 is converted into a signal of a logarithmic value by a logarithm compression circuit 58, 60, 72, respectively. That is, the output values of the logarithm compression circuit 58, 60, 72 are $\log\{Re(a)|Y|^2\}$, $\log\{|Y|^2\}$, $\log\{Im(a)|Y|^2\}$, respectively.

A subtracter 61 outputs a difference between the output value $\log\{Re(a)|Y|^2\}$ of the logarithm compression circuit 58 and the output value $\log\{|Y|^2\}$ of the logarithm compression circuit 60. A subtracter 73 outputs a difference between the output signal from the logarithm compression circuit 72 and the output signal from the logarithm compression circuit 60. That is, the output value of the subtracter 73 is $\log\{Im(a)\}$.

Variable gain amplifiers 62, 64 are digital variable amplifiers in which gains are controlled corresponding to the output values of the subtracters 61, 73. The variable gain amplifier 62 amplifies the output signal (first signal) from the AD converter 12 and obtains a signal which is an exponential of the output value from the subtracter. Therefore, the output value of the variable gain amplifier 62 results is $Re(a)\{Y(t)+bX(t)\}$. Similarly, the output value of the variable gain amplifier 74 results in $J \cdot Im(a)\{Y(t)+bX(t)\}$.

Note that the same function may be realized by substituting the logarithm compression circuits 58, 60 and the subtracter 61 with a divider, substituting the logarithm compression circuits 60, 72 and subtracter 73 with another divider, and substituting the variable gain amplifiers 62, 74 with a mixer in the digital region, that is, a multiplier.

The adder 75 calculates the sum of the output signal from the variable gain amplifier 62 and the output signal from the variable gain amplifier 74. Therefore, the output value of the adder 75 is $a\{Y(t)+bX(t)\}$. The subtracter 63 subtracts the output signal of the adder 75 from the output signal (second signal) of the AD converter 11. Therefore, the output vale from the subtracter 63 is $\{X(t)+aY(t)\}-a\{Y(t)+bX(t)\}=X(t)=abX(t)$. In other words, an output signal with an output value in which the image signal $Y(t)$ is removed from the second signal is output from the subtracter 63, and if a switch 67 selects the subtracter 63, this signal is output from the output terminal 68.

The aforementioned action of the signal processor 13 is for a case where $|Y|$ is larger than $|X|$ more than some degrees (10 dB larger in the aforementioned explanation).

On the contrary, if $|Y|$ is almost equal or less compared to $|X|$, for example, the signal processing in the aforementioned signal processor worsens the image suppression ratio. The signal processor 13 incorporates a function to cope with such a case. The function will be explained below.

The mean square calculation circuit 64 (second intensity detection means) calculates the mean square value of the signal (second signal) output from the AD converter 11 and outputs it. Taking into account that $X(t)$ and $Y(t)$ have no correlation, the result of mean-squaring the output value $X(t)+aY(t)$ of the AD converter 11 is $|X|^2+\{|a||Y|\}^2$. The logarithm compression circuit 65 converts the output value from the AD converter 11 into a logarithmic value. That is, the output value of the logarithm compression circuit 65 is $\log\{|X|^2+\{|a||Y|\}^2\}$.

On the other hand, the output signal (first signal) from the AD converter 12 is mean-squared and converted into a logarithm, by the mean square calculation circuit 59 (first intensity detecting means) and the logarithm compression circuit 60.

The subtracter 77 calculates the difference between the output value $\log\{|X|^2+\{|a||Y|\}^2$ from the logarithm compression circuit 65 and the output value $\log\{|Y|^2+\{|b||X|\}^2\}$ from the logarithm compression circuit 60. Thus, the output value of the subtracter 77 is $\log[[|X|^2+\{|a||Y|\}^2]/[|Y|^2+\{|b||X|\}^2]]$. Taking into account the fact that the typical value of |a| and |b| is about −30 dB, if the intensity of |X| is larger than that of |Y| by 30 dB, the output value from the subtracter 77 is about $\log\{1/|b|^2\}$ This value is +30 dB.

On the other hand, if the intensity ratio of |X| to |Y| is in a range between −30 dB and +30 dB, the output value from the subtracter 77 can be approximated to $\log\{|X|^2/|Y|^2\}$. Further, if the intensity of |X| is smaller than the intensity-30 dB of |Y|, the output value from the subtracter 77 is almost $\log\{|a|^2\}$ This value is −30 dB.

The output value basically represents the intensity ratio of |X| to |Y|, that is, the intensity ratio of the desired signal to the image signal (disturbance signal) in dB scale, while the output value from the subtracter 77 has the maximum saturated output value of $\log\{1/|a|^2\}$ and the minimum one of $\log\{|a|^2\}$.

The output signal from the subtracter 77 is input into a comparator 66, and if the output value of the subtracter 77 exceeds a predetermined threshold value, the switch 67 is switched onto the side directly connecting to the input terminal 54, and if it does not exceed the predetermined threshold value, the switch 67 is switched onto the side linking to the subtracter 63. Here, the threshold value is preferably more than −30 dB and less than 30 dB.

As described above, according to the present embodiment, if the ratio of the desired signal intensity to the image signal (disturbance signal) intensity exceeds a threshold value, it is possible to output the output signal from the AD converter 11, that is, the output signal from the conventional Hartley-type image rejection mixer, from the output terminal 68 of the signal processor 13. In this case, the intensity ratio of the desired signal to the image signal (disturbance wave signal) exceeds a certain degree. Thus, even with an image suppression ratio obtained in the Hartley-type image rejection mixer of the conventional art, it is possible to obtain enough S/N ratio in the subsequent signal processing in the demodulation circuit.

On the other hand, if the ratio of the desired signal intensity to the image signal (disturbance signal) intensity is smaller than the threshold value, a signal, in which the image suppression ratio is raised by using the output signals from the AD converters 11 and 12, is output from the output terminal 68 of the signal processor 13. Note that this operation becomes effective when the image signal (disturbance signal) intensity is larger in some degree compared to the desired signal intensity. In such a case, the image suppression ratio is not enough in the conventional Hartley-type image rejection mixer.

Further, if the image signal intensity is larger than the desired signal intensity, the image rejection ratio is not enough in the conventional Hartley-type image rejection mixer. In this case, a signal in which the image suppression ratio is raised is output from the output terminal 68 of the signal processor 13 in the present embodiment. Moreover, in a case where the image signal intensity is not so strong, a Hartley-type image rejection mixer provides a sufficient image suppression ratio. In this case, the output signal (sum signal, that is, the second signal) from the adder 7 (FIG. 1) is output, which is the identical signal to that from the conventional Hartley-type image rejection mixer.

According to the present embodiment, it is possible to solve such problems that the typical image rejection ratio is about 30 dB and not enough when considering dispersions of transistors and passive components constituting the image rejection mixer, and/or temperature variations.

Further, as described above, the configuration with an image rejection filter in front of a down-conversion mixer, which has been introduced as another conventional art causes such problems that not only a loss for the image signal but also a loss for the desired signal increase, and the characteristics of the receiver is degraded. Further, in such an image rejection filter, the frequency band of an object signal is in RF region. Thus, it is impossible to integrate on a semiconductor chip and problems arise in miniaturization or cost reduction. In the present embodiment, such problems will not arise essentially.

Further, in the method in which mixers and phase shifters are tunable from the outside and a feedback control is performed to raise an image suppression ratio, as described as another conventional art, there are difficulties in in-situ monitoring of an image suppression ratio in a radio, compensation for changes in element characteristics due to temperature changes, and high operational accuracy of components newly added for a feedback control. This causes cost increase, yield drops, and lack of stability in practical use. In the present embodiment, these problems will not arise.

In the present embodiment, although $\cos \omega_{LD}t$ and $\sin \omega_{LD}t$ with a 90-degree phase difference are used as local signals input into the mixers 2, 3 as shown in FIG. 1, the local signals input into the mixer 2, 3 may have the same phase, and the phase difference between the RF signals input into the mixers 2, 3 respectively, may be 90 degrees.

Further, in the present embodiment, although the phase shifter 6 is provided as a phase delaying means as shown in FIG. 1, the phase delaying means may consist of a phase shifter which delays the phase of the I-signal converted by the mixer 2 by α degree, and of a phase shifter which advances the phase of the Q-signal converted by the mixer 3 by 90−α degree. Here, if α is set to zero degree, the phases are equal to those shown in FIG. 1. If a is set to 90 degrees, the phase of I-signal advances 90 degrees.

Second Embodiment

The signal processing method and the device, for performing the digital signal processing which is the best mode for carrying out the present invention, have been described in the first embodiment. However, the present invention is not limited to this, and can be applied to a signal processing method and a device for carrying out analog signal processing. In second to forth embodiments below, embodiments in which the present invention is applied to analog signal processing will be described.

Figure 6:
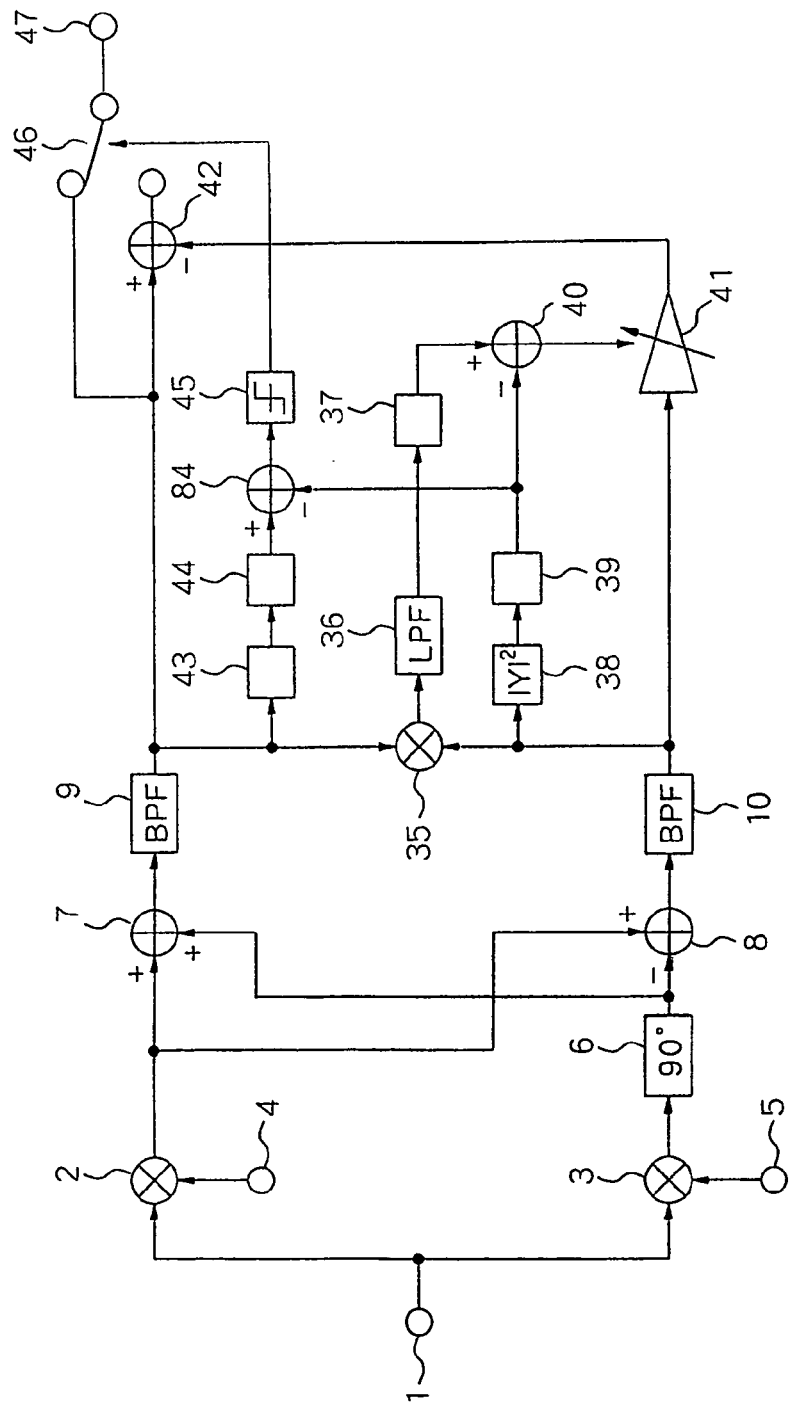
FIG. 6 is a schematic diagram showing the configuration of a signal processing device according to a second embodiment of the present invention.

First, a signal processing method and a device according to a second embodiment of the present invention will be explained. FIG. 6 is a schematic diagram showing the configuration of a signal processing device according to the present embodiment.

A signal input into an input terminal 1 shown in FIG. 6 is distributed into two branches. The input signal in one branch is mixed in the mixer 2 with a local signal $\cos(\omega_{LD}{}^*t)$ input into an input terminal 4. The signal down-converted in the mixer 2 becomes an I-signal. The input signal in other branch is mixed in the mixer 3 with a local signal $\sin(\omega_{LD}{}^*t)$ input into an input terminal 5. The signal down-converted in the mixer 3 becomes a Q-signal. The phase shifter 6 delays the Q-signal by 90 degrees.

The adder 7 adds the I-signal and the Q-signal. The added signal (second signal) passes through the band pass filter 9, whereby signals in undesired frequency bands are cut from the signal. The output signal from the band pass filter 9 is the sum of the desired signals and the attenuated image signal and the attenuated image.

The subtracter 8 calculates the difference between the I-signal and the Q-signal. The subtracted signal (first signal) passes through the band pass filter 10 having the same cut-off characteristics as those of the band pass filter 9, whereby signals in undesired frequency bands are cut from the subtracted signal. The output signal of the band pass filter 10 is the sum of the image signal and the attenuated desired signal.

In the present embodiment, since signals are processed in the analog domain, the AD converters 11, 12 are not provided.

A mean square calculation circuits 43, 38 calculate the mean square values of the output signals (second signal and first signal) from the band pass filters 9, 10, that is, the average power values, respectively. A mixer 35 multiplies the output signal from the band pass filter 9 by the output signal from the band pass filter 10. A low-pass filter 36 only outputs components near the direct current (low frequency components) of the output signal from the mixer 35. Each output value of the low-pass filter 36 and the mean square calculation circuits 38, 43 is converted into a logarithmic value in a logarithm compression circuit 37, 39, 44, respectively.

A subtracter 40 calculates a subtracted signal by subtracting the output value of the logarithm compression circuit 39 from the output value of the logarithm compression circuit 37. The gain of the variable gain amplifier 41 is controlled corresponding to the output value from the subtracter 40. The variable gain amplifier 41 is so designed that the gain becomes equal to a value obtained by dividing the output value from the low-pass filter 36 by the output value from the mean square calculation circuit 38. In other words, the variable gain amplifier 41 has a function of using a logarithmic value output from the subtracter 40 as an input value, and linearly mapping the value into a gain described in dB.

A subtracter 42 subtracts the output value of the output signal from the variable gain amplifier 41 from the output value of the output signal (second signal) from the band pass filter 9. A subtracter 84 outputs the difference between the output value of the logarithm compression circuit 44 and the output value of the logarithm compression circuit 39.

The output signal from the subtracter 84 is input into a comparator 45. If the output value from the subtracter 84 exceeds a predetermined threshold value of the comparator 45, a switch 46 is switched onto the output side of the band pass filter 9, and if the value does not exceed, the switch is switched onto the subtracter 42. The output signal is output from an output terminal 47 through the switch 46.

For example, if the phase shifter 6 for delaying the phase by 90 degrees is highly accurate, if the phase difference between the local signals input into the mixers 2, 3 is highly accurate, and if there is a difference between the gain of the signal path from the input terminal 1 up to the right front of the adder 7 and that of the signal path from the input terminal 1 up to the right front of the subtracter 8, the phase of the image signal included in the output signal from the band pass filter 9 and that of the image signal included in the output signal from the band pass filter 10 are in-phase or antiphase. The present embodiment is particularly effective in improving the image suppression ratio in such a case.

Third Embodiment

Figure 7:
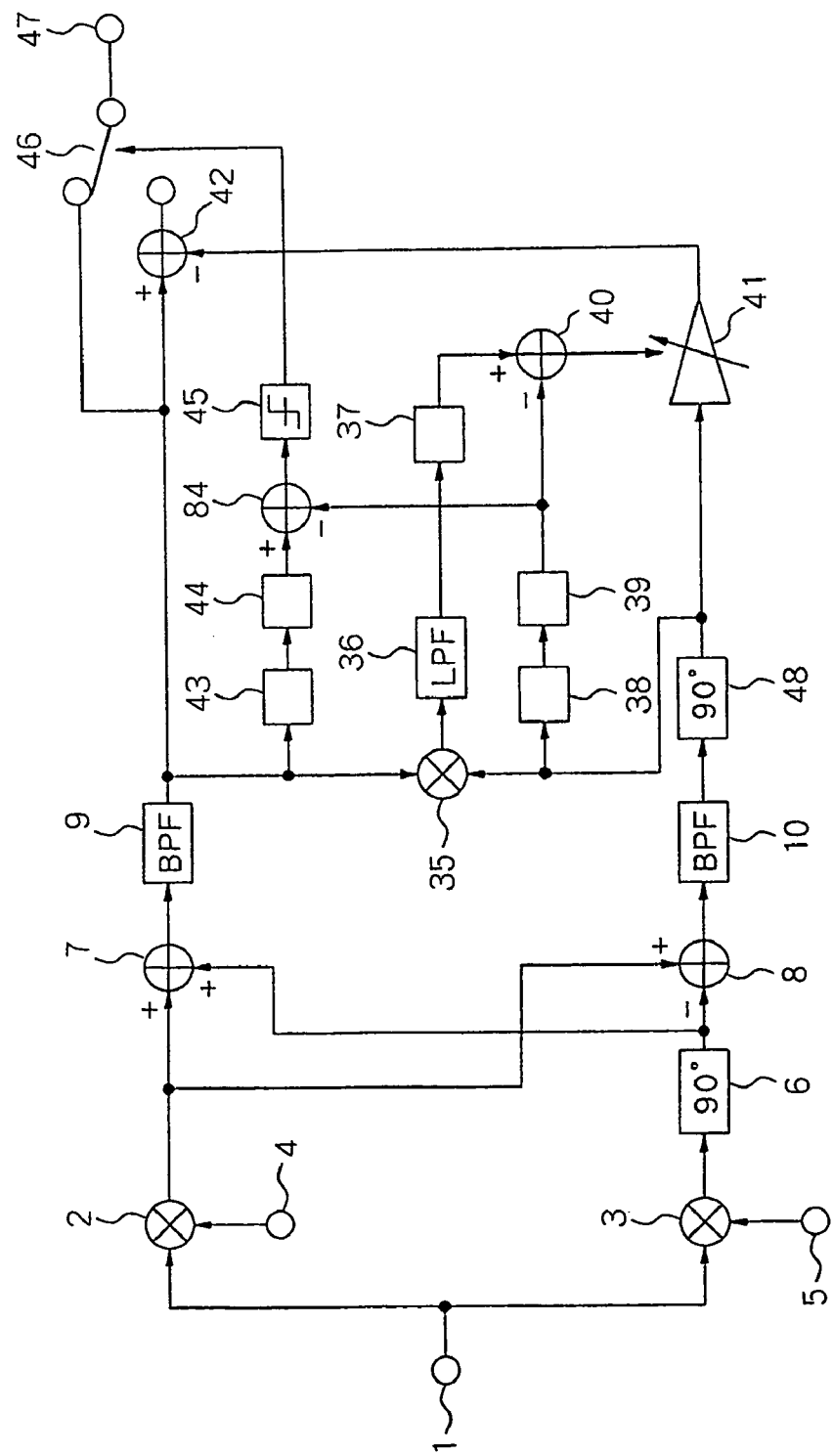
FIG. 7 is a schematic diagram showing the configuration of a signal processing device according to a third embodiment of the present invention.

Next, a signal processing method according to a third embodiment of the present invention and a device therefor will be explained. FIG. 7 is a schematic diagram showing the configuration of a signal processing device according to the present embodiment. The difference from the second embodiment is that a phase shifter 48 for delaying a signal from the band pass filter 10 by 90 degrees is connected to the output of the band pass filter 10.

When the gain of the signal path from the input terminal 1 to the input node of the adder 7 and that of the signal path from the input terminal 1 to the input node of the subtracter 8 are well balanced, and the phase delay of the phase shifter 6 or the phase difference between the local signals input into the mixers 2, 3 is not accurate, the image signal included in the output signal from the band pass filter 9 and the image signal included in the output signal from the band pass filter 10 are shifted by 90 degrees in phase.

The present embodiment is particularly effective in improving the image suppression ratio in such a case.

Forth Embodiment

Figure 8:
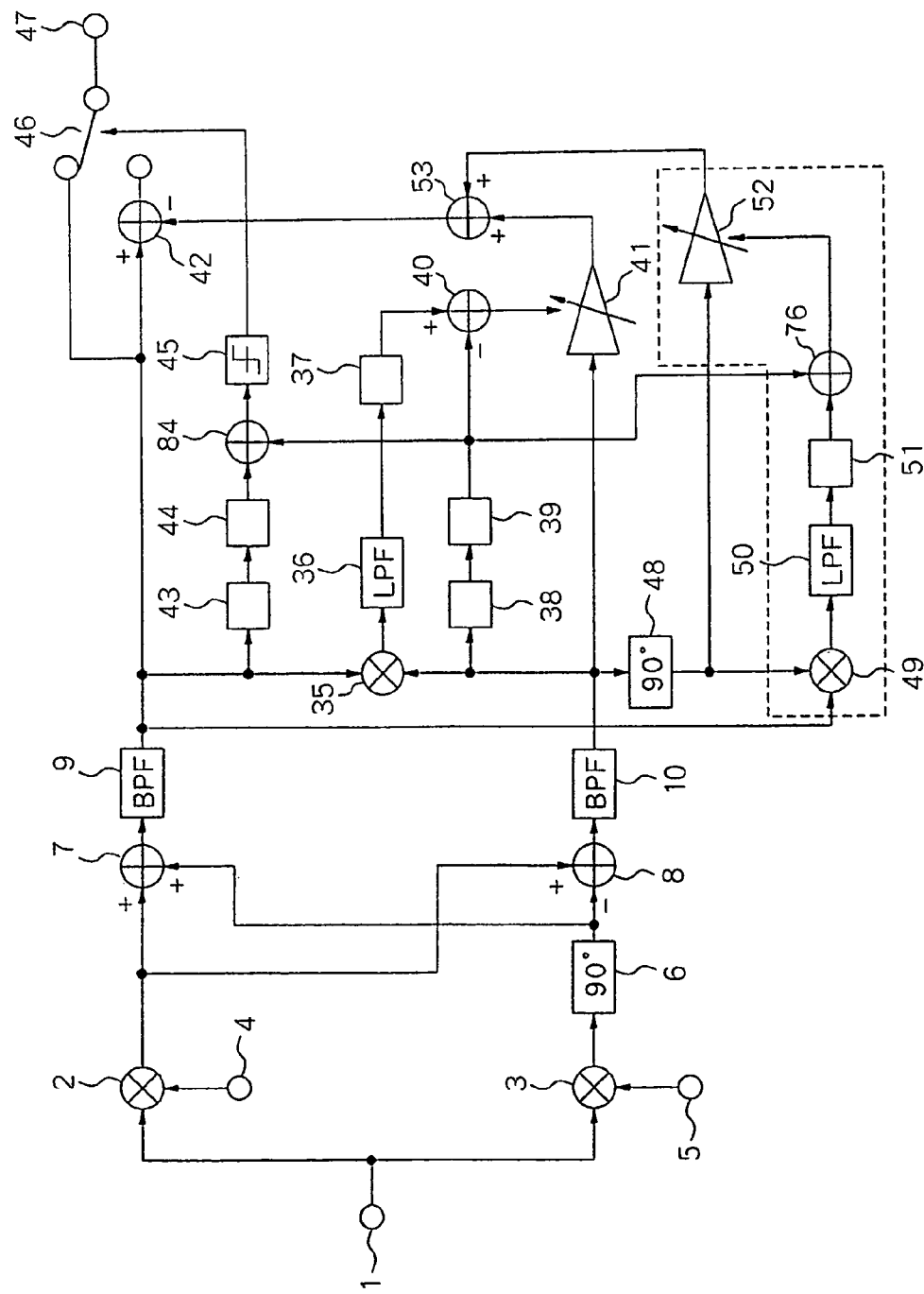
FIG. 8 is a schematic diagram showing the configuration of a signal processing device according to a forth embodiment of the present invention.

Next, a signal processing method and a device according to a forth embodiment of the present invention will be explained. FIG. 8 is a schematic diagram showing the configuration of a signal processing device according to the present embodiment. The difference from the signal processing device of the second embodiment shown in FIG. 6 is that the signal processing device of the present embodiment includes a phase shifter 48 for delaying a phase by 90 degrees, a mixer 49, a low-pass filter 50, a logarithm compression circuit 51, a subtracter 76, a variable gain amplifier 52, and an adder 53, in addition to the components composing the signal processing device of the second embodiment shown in FIG. 6.

A circuit block consisting of the mixer 49, the low-pass filter 50, the logarithm compression circuit 51, the subtracter 76, and the variable gain amplifier 52 (shown with a dotted line in FIG. 8) has the same configuration as and operates in the same way as the circuit block shown in FIG. 6 consisting of the mixer 35, the low-pass filter 36, the logarithm compression circuit 37, the subtracter 40, and the variable gain amplifier 41.

The variable gain amplifier 41 outputs signals to offset a portion of image signal, which is included in the output signal from the band pass filter 9 and has the same phase as or the opposite phase to the image signals included in the output signal from the band pass filter 10.

On the other hand, the variable gain amplifier 52, added in the configuration shown in FIG. 8, outputs signals to offset a portion of image signal, which is included in the output signal from the band pass filter 9, and has a phase difference of 90 degrees to the image signals included in the output signal from the band pass filter 10, since the phase shifter 48 is connected to the input of the variable gain amplifier 52.

The output signal from the variable gain amplifier 41 and the output signal from the variable gain amplifier 52 are added in the adder 53. The subtracter 42 subtracts the sum signal of the adder 53 from the output signal of the band pass filter 9, to thereby remove the image signals included in the output signal from the band pass filer 9.

In the present embodiment, the image rejection ratio can be improved irrespective of the rotation amount of the phase of the image signal included in the output signal from the band pass filter 9.

Fifth Embodiment

In he signal processing methods and the devices according to the second to forth embodiments, the signal processing method and the devices for performing analog signal processing according to the present invention have been described. In fifth to eleventh embodiments, other embodiments of signal processing methods and devices with the digital signal processing described in the first embodiment will be described below. Signal processing devices of the fifth to eleventh embodiments only differ in the configuration and the operation of the signal processor 13.

Figure 9:
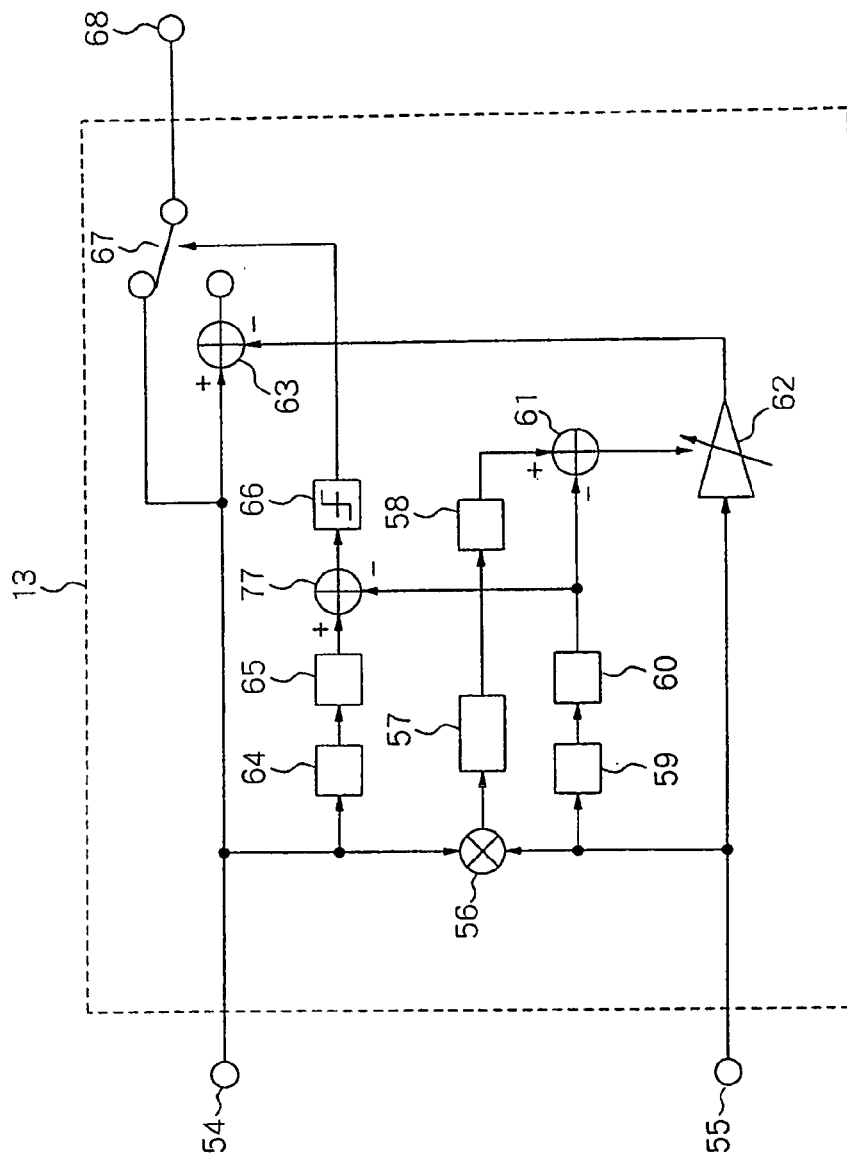
FIG. 9 is a schematic diagram showing the configuration of a signal processing device according to a fifth embodiment of the present invention.

First, the fifth embodiment of the present invention will be described. FIG. 9 is a schematic diagram showing the configuration of the signal processor 13 according to the present embodiment. All components of the signal processor 13 shown in FIG. 9 are for processing digital signals. The signal processor 13 includes two input terminals 54, 55.

Similar to the first embodiment, the output signal (second signal) from the AD converter 11 is input into the input terminal 54 and the output signal (first signal) from the AD converter 12 is input into the input terminal 55. The mean square calculation circuit 64 calculates the mean square of the signal from the input terminal 54 (second signal), and the mean square calculation circuit 59 calculates the means square of the signal from the input terminal 55 (first signal).

The mixer 56 multiplies the two input signals (first signal and second signal). The average calculation circuit 57 calculates the time-average value of the output signal from the mixer 56. The output values of the average calculation circuit 57 and the mean square calculation circuits 59, 64 are converted into logarithmic values in the logarithm compression circuits 58, 60, 65, respectively. The subtracter 61 calculates a subtracted signal by subtracting the output value of the logarithm compression circuit 60 from the output value of the logarithm compression circuit 58. Referring to the output value from the subtracter 61, the gain of the variable gain amplifier 62 in the digital domain is controlled. Note that the same function can be realized by substituting the circuit consisting of the mean square circuits 58, 60 and the subtracter 61 with a divider, and by substituting the variable gain amplifier 62 with a multiplier.

The subtracter 63 outputs a subtracted signal obtained by subtracting the output signal of the variable gain amplifier 62 from the signal of the input terminal 54 (second signal). The subtracter 77 calculates a subtracted signal by subtracting the output value of the logarithm compression circuit 60 from the output value of the logarithm compression circuit 65. The output signal from the subtracter 77 is input into the comparator 66. If the output value from the subtracter 77 exceeds a predetermined threshold value of the comparator 66, the switch 67 is connected to the input terminal 54, and if the value does not exceed, the switch 67 is connected to the subtracter 63. The output terminal 68 outputs the output signal through the switch 67.

Similar to the second embodiment shown in FIG. 6, the present invention is particularly effective in improving the image compression ratio in the case where the image signal included in the signal input through the input terminal 54 and the image signal included in the signal input through the input terminal 55 are in-phase or antiphase.

Sixth Embodiment

Figure 10:
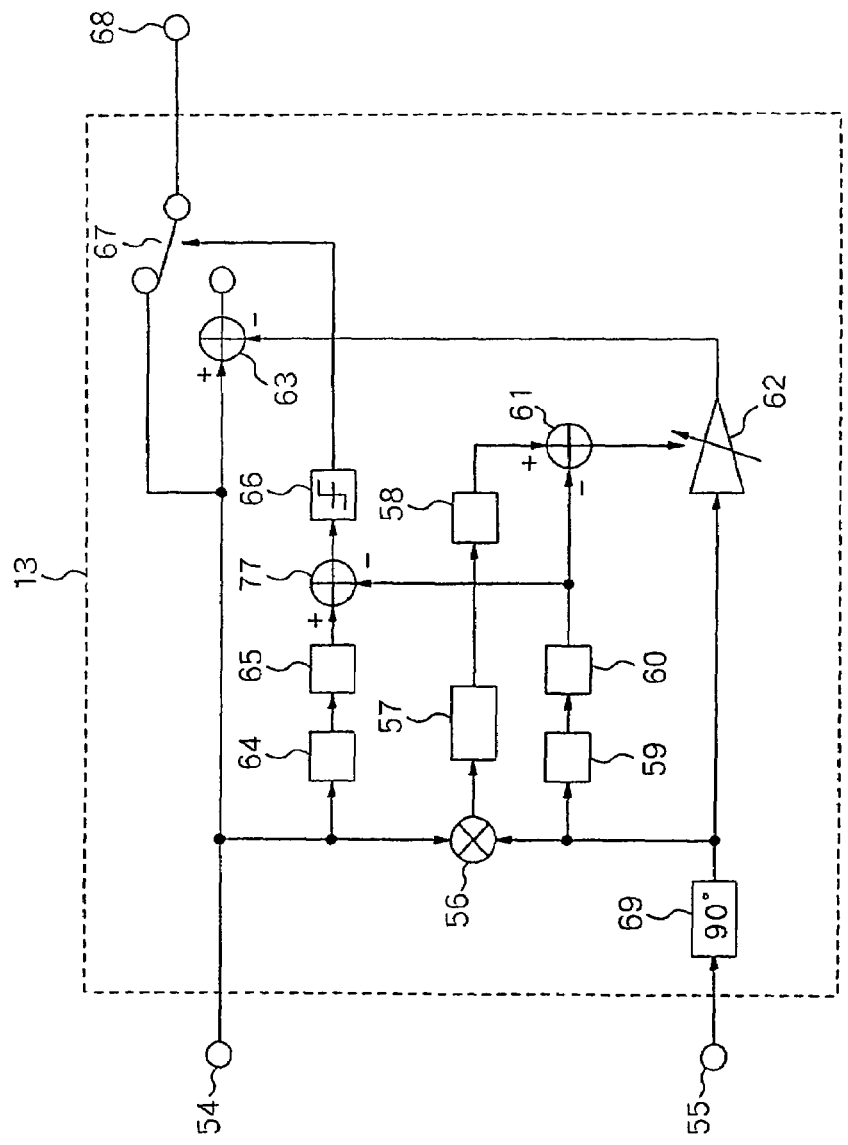
FIG. 10 is a schematic diagram showing the signal processor 13 in a signal processing device according to a sixth embodiment of the present invention.

Next, a sixth embodiment of the present invention will be explained. FIG. 10 is a schematic diagram showing the configuration of the signal processor 13 according to a signal processing device of the present embodiment. The signal processor 13 according to the signal processing device of the present embodiment has a phase shifter 69 connected to the input terminal 55 to delay the phase by 90 degrees in the digital domain. This is a difference from the signal processor 13 shown in FIG. 9.

Similar to the analog signal processing in the third embodiment shown in FIG. 7, the present embodiment is particularly effective to improve the image suppression ratio in the case where the image signal included in the signal (second signal) input through the input terminal 54 and the image signal included in the signal (first signal) input through the input terminal 55 are different in phase by 90 degrees.

Seventh Embodiment

Figure 11:
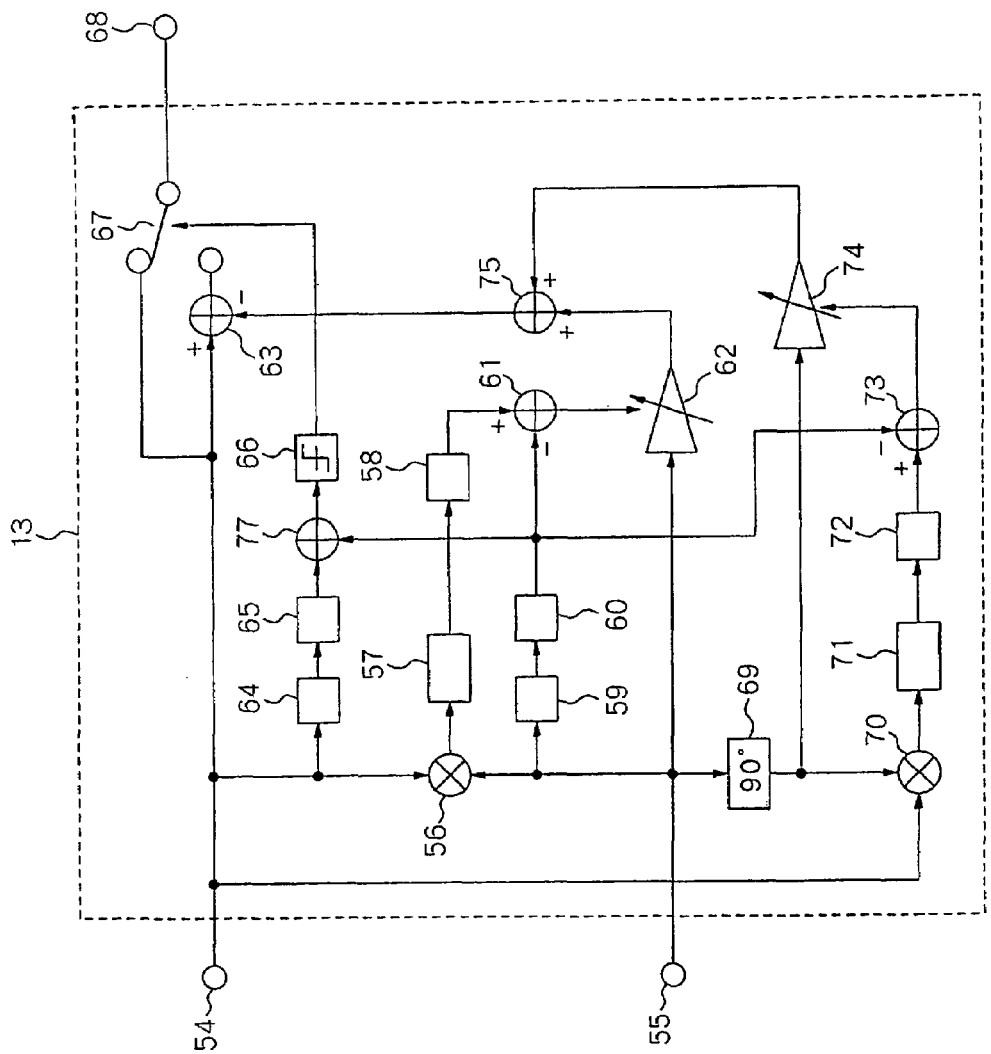
FIG. 11 is a schematic diagram showing the configuration of the signal processor in a signal processing device according to a seventh embodiment of the present invention.

Next, a seventh embodiment of the present invention will be described. FIG. 11 is a schematic diagram showing the configuration of the signal processor 13 according to a signal processing device of the present embodiment. This signal processor 13 consists of a phase shifter 69 for delaying phases by 90 degrees, a mixer 70, an average calculation circuit 71, a logarithm compression circuit 72, a subtracter 73, a variable gain amplifier 74, and an adder 75, in addition to the components in the embodiment shown in FIG. 9.

The operation of the signal processor 13 is identical with that of the circuit following the band pass filters 9 10 in the forth embodiment shown in FIG. 8, while the signal processor 13 operates in the digital domain.

Therefore, similar to the forth embodiment shown in FIG. 8, the present embodiment can improve the image rejection ratio under any given phase rotation of the image signal included in the signal input from the input terminal 54.

Eighth Embodiment

Figure 12:
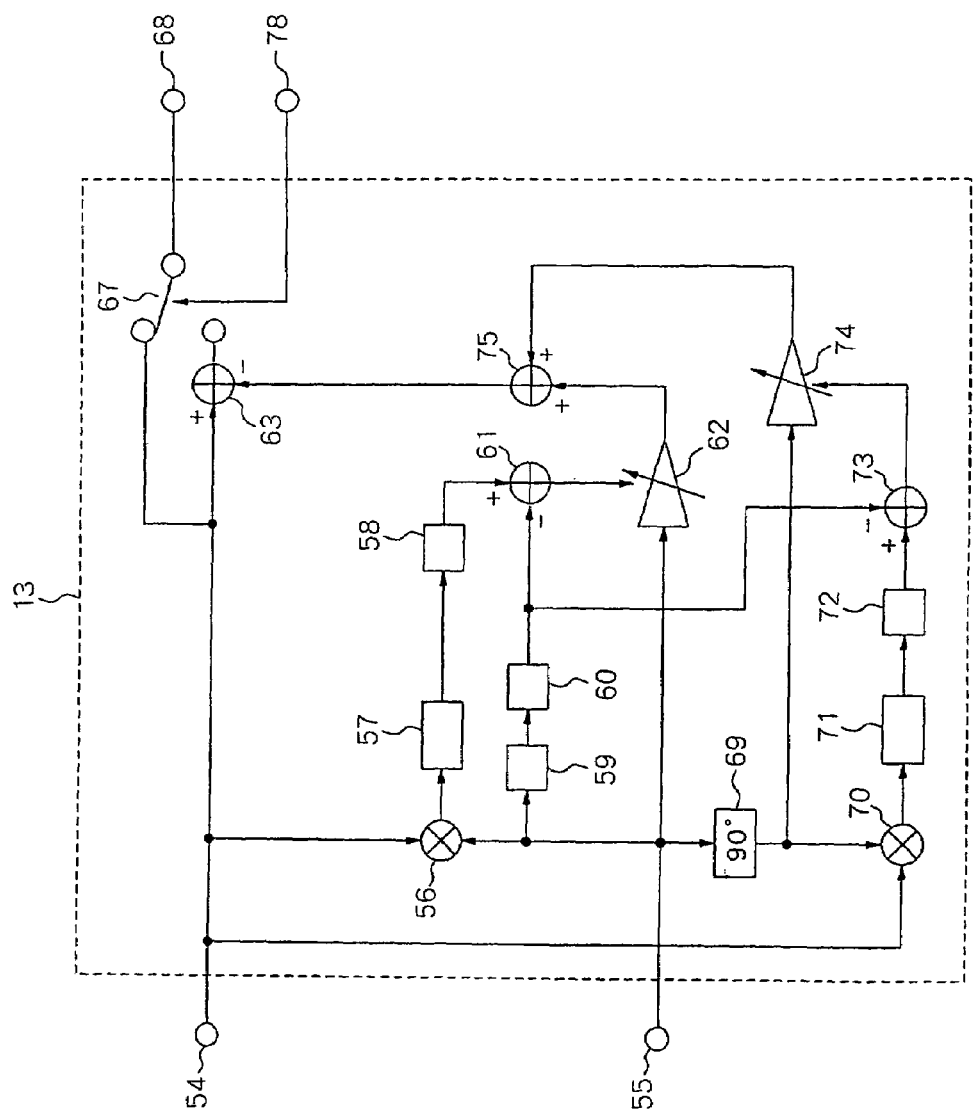
FIG. 12 is a schematic diagram showing the configuration of the signal processor 13 in a signal processing device of an eighth embodiment according to the present invention.

Next, an eighth embodiment of the present invention will be described. FIG. 12 is a schematic diagram showing the configuration of the signal processor according to a signal processing device of the present embodiment. As shown in FIG. 12, this signal processor 13 is different from the signal processor 13 shown in FIG. 11 in that the switch 67 is controlled by the external signal input into the input terminal 78. Thus, the following components in this signal processor 13 in FIG. 11 are omitted: the mean square calculation circuit 64, the logarithm compression circuit 65, the comparator 66, and the subtracter 77, for controlling the switch 67.

Ninth Embodiment

Figure 13:
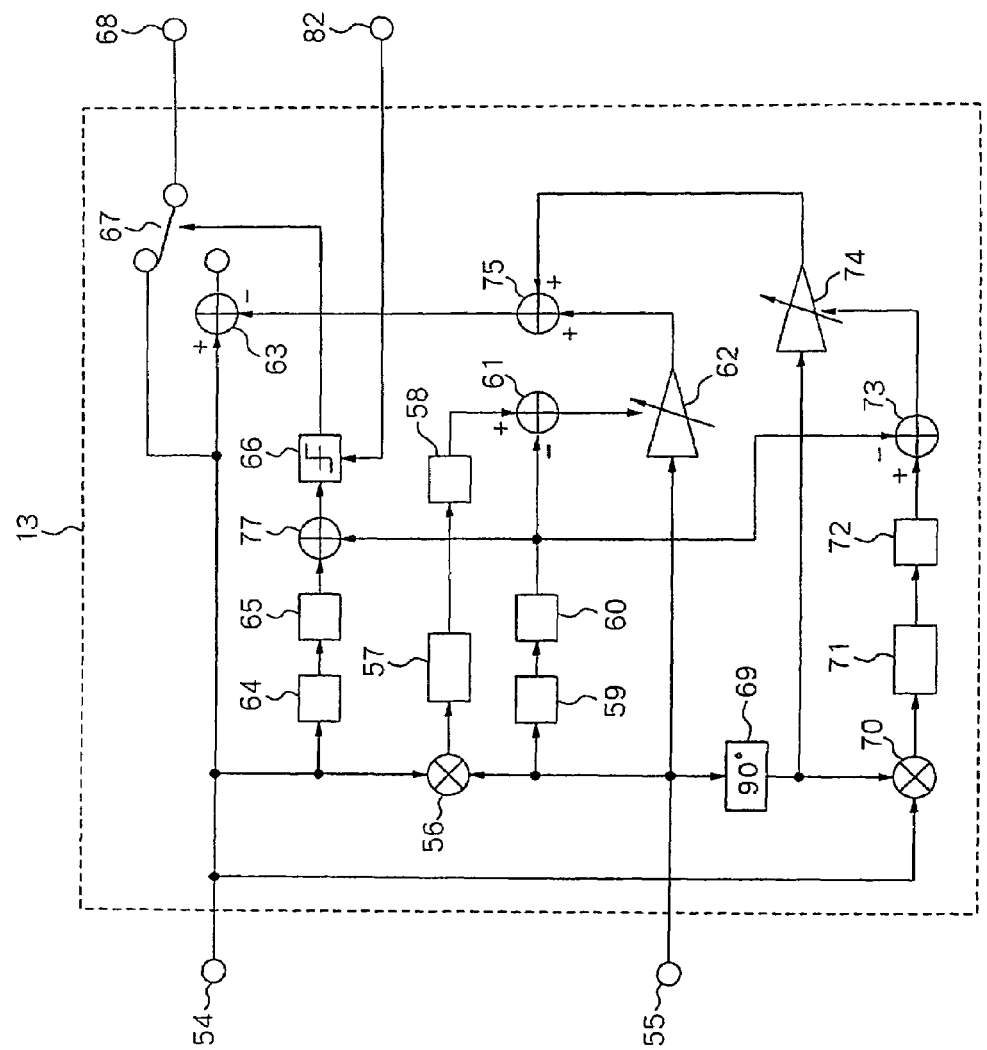
FIG. 13 is a schematic diagram showing the configuration of the signal processor 13 in a signal processing device according to a ninth embodiment of the present invention.

Next, a ninth embodiment of the present invention will be described. FIG. 13 is a schematic diagram showing the signal processor 13 according to a signal processing device of the present embodiment. The configuration of the signal processor 13 according to the signal processing device of the present embodiment is same as that of the signal processor 13 of the seventh embodiment shown in FIG. 11, except that the threshold value of the comparator 66 cam be input from the input terminal 82.

Tenth Embodiment

Figure 14:
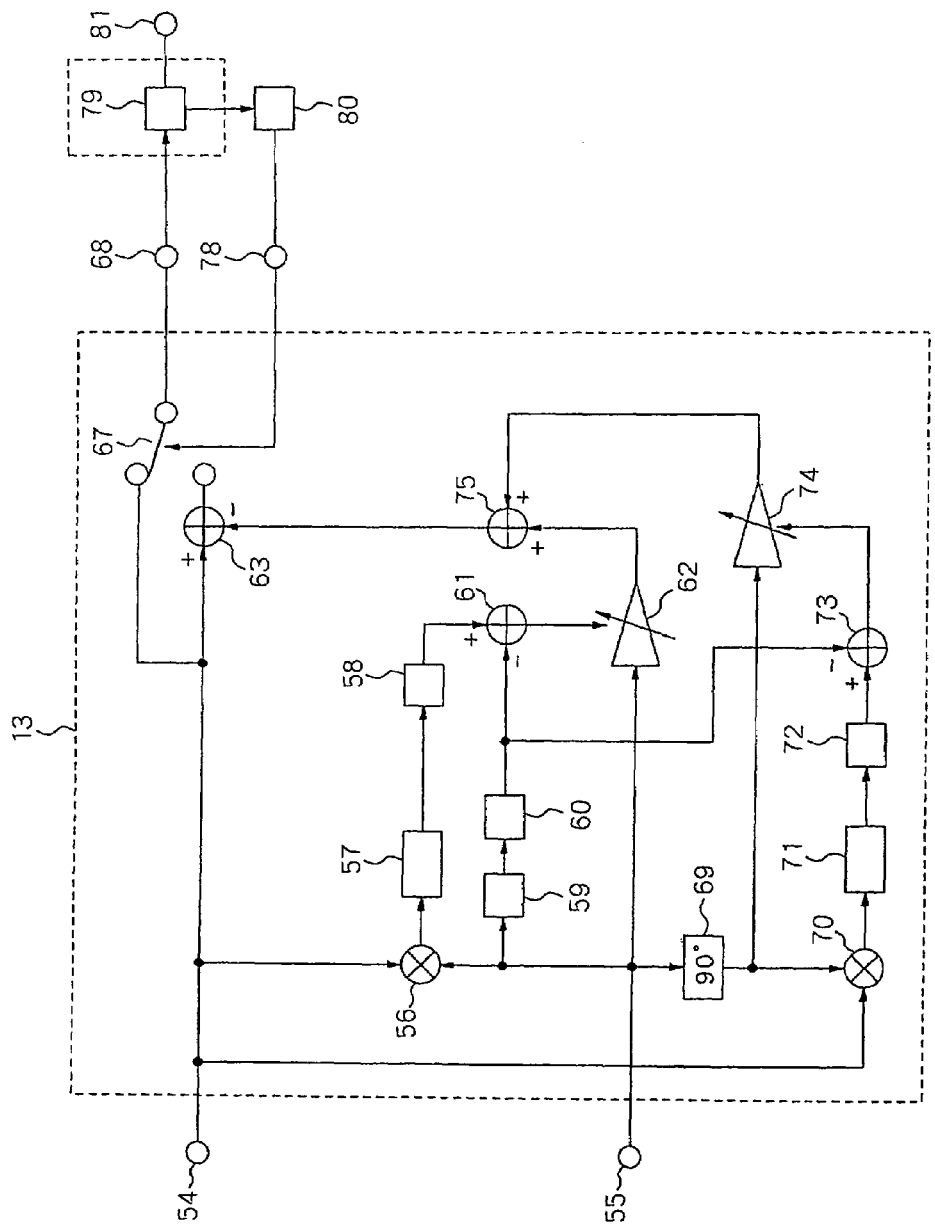
FIG. 14 is a diagram showing a part where digital signal processing is performed, including the signal processor 13 in a signal processing device according to a tenth embodiment of the present invention.

Next, a tenth embodiment of the present invention will be explained. FIG. 14 shows digital signal processing part, including the signal processor 13 of a signal processing device according to the present embodiment. The configuration of the signal processor 13 is same as that of the signal processor 13 shown in FIG. 12.

In the present embodiment, a signal processing circuit 79 (first signal processing circuit) is connected to the output terminal 68 of the signal processor 13. The signal processing circuit 79 performs demodulation and error correction of signal from the output terminal 68. Signal which is demodulated and error-corrected by the signal processing circuit 79 is output from the output terminal 81.

The error rate detected in the signal processing circuit 79 is output from the other output terminal of the signal processing circuit 79, and input into another signal processing circuit 80 (second signal processing circuit). If the error rate exceeds a predetermined threshold value, the signal processing circuit 80 outputs a signal for switching the switch 67 to the switch 67 through the input terminal 78. Further, the signal processing circuit 80 monitors the error rate signal after the switch 67 is switched, and the signal processing circuit 80 generates a signal for returning the switch 67 back when the error rate increases more than that before switched. Then, the signal processing circuit 80 switches the switch 67 for a predetermined time period even if the error rate exceeds the threshold value.

In the present embodiment, on/off controlling of an image rejection function for reducing the error rate of the received signal can be performed by switching the switch 67, using the signal processing circuits 79, 80.

Eleventh Embodiment

Figure 15:
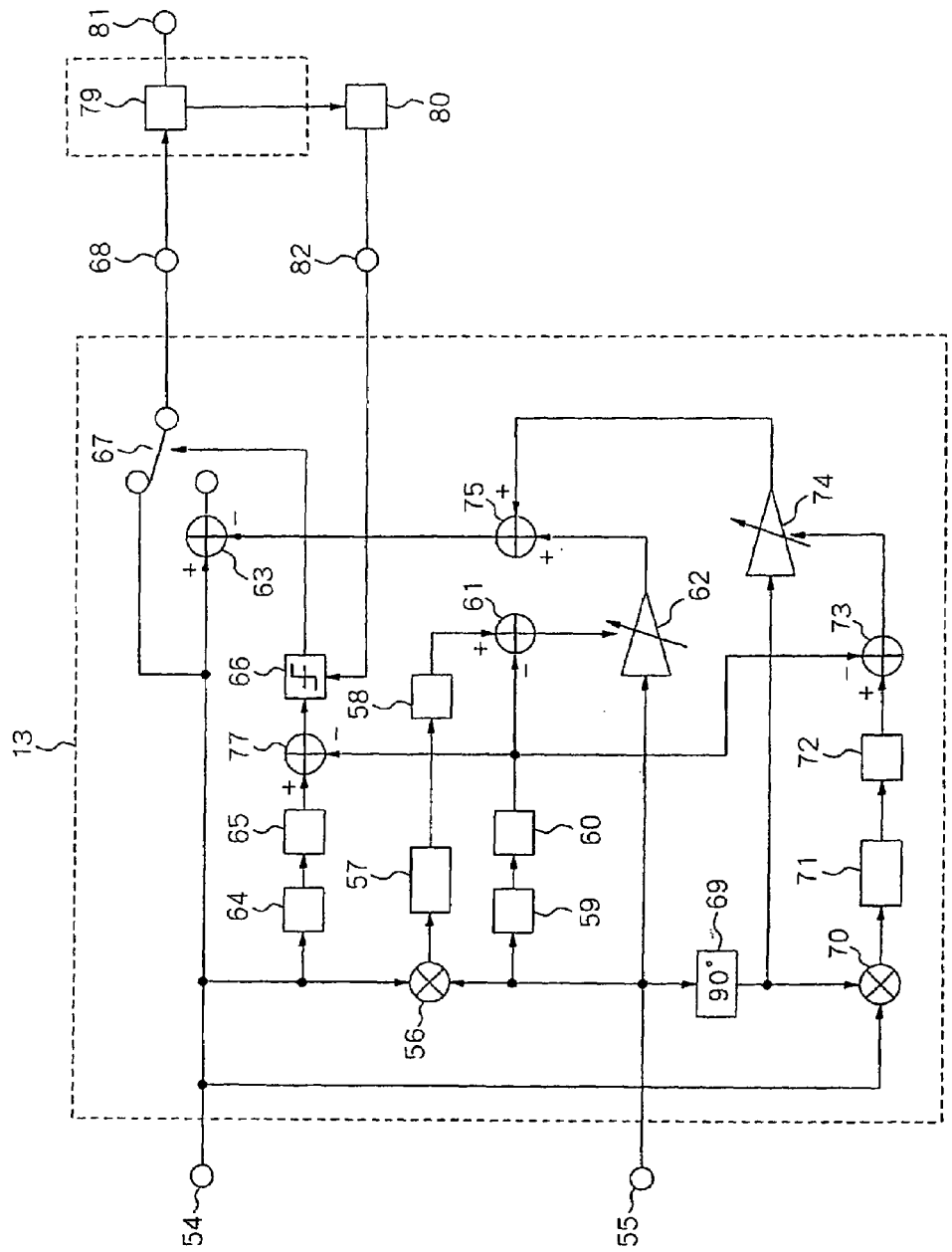
FIG. 15 is a diagram showing a digital signal processing unit including the signal processor 13 according to an eleventh embodiment of the present invention.
Figure 16:
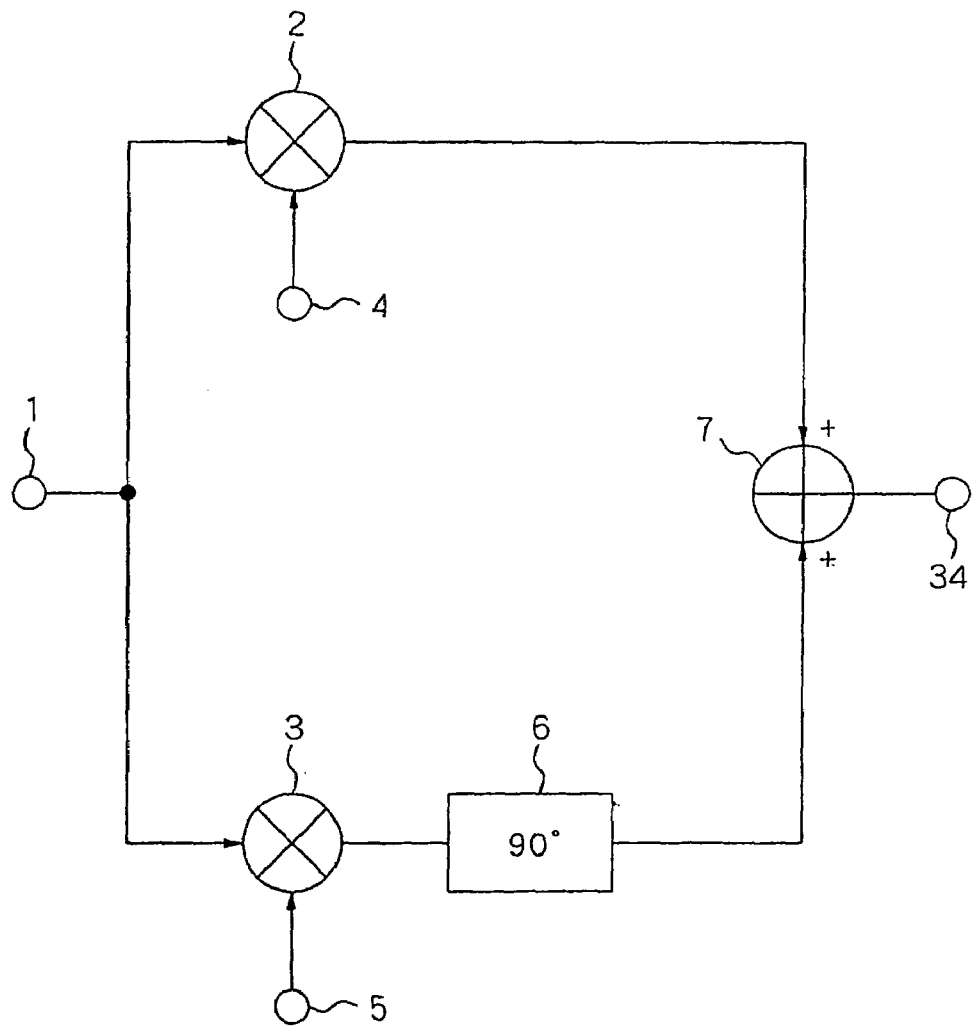
FIG. 16 is a schematic diagram showing the configuration of a Hartley-type image rejection mixer which is a typical image rejection mixer of conventional art.
Figure 17:
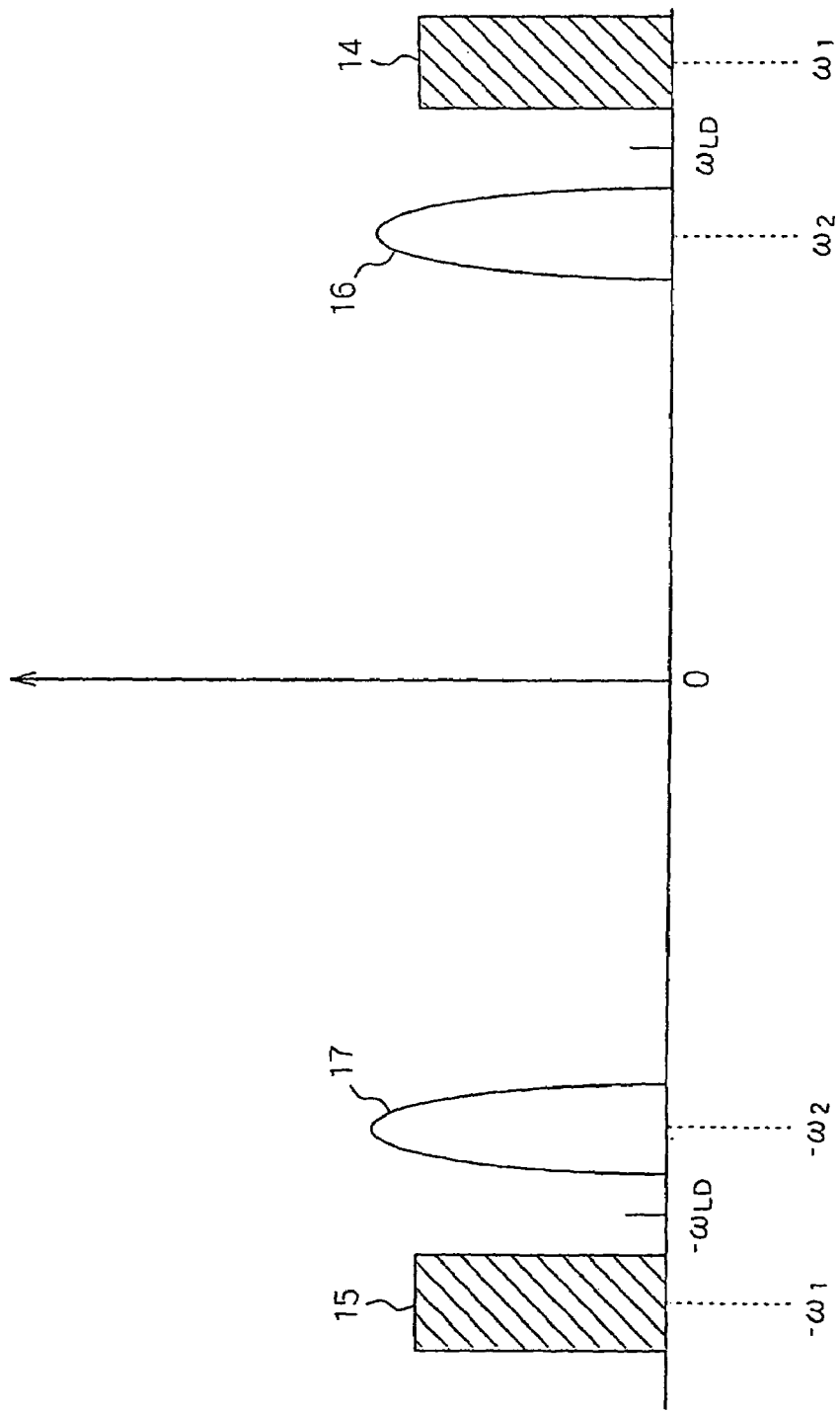
FIG. 17 is a chart showing an example of the frequency distribution of an input signal input into the Hartley-type image rejection mixer shown in FIG. 16.
Figure 18:
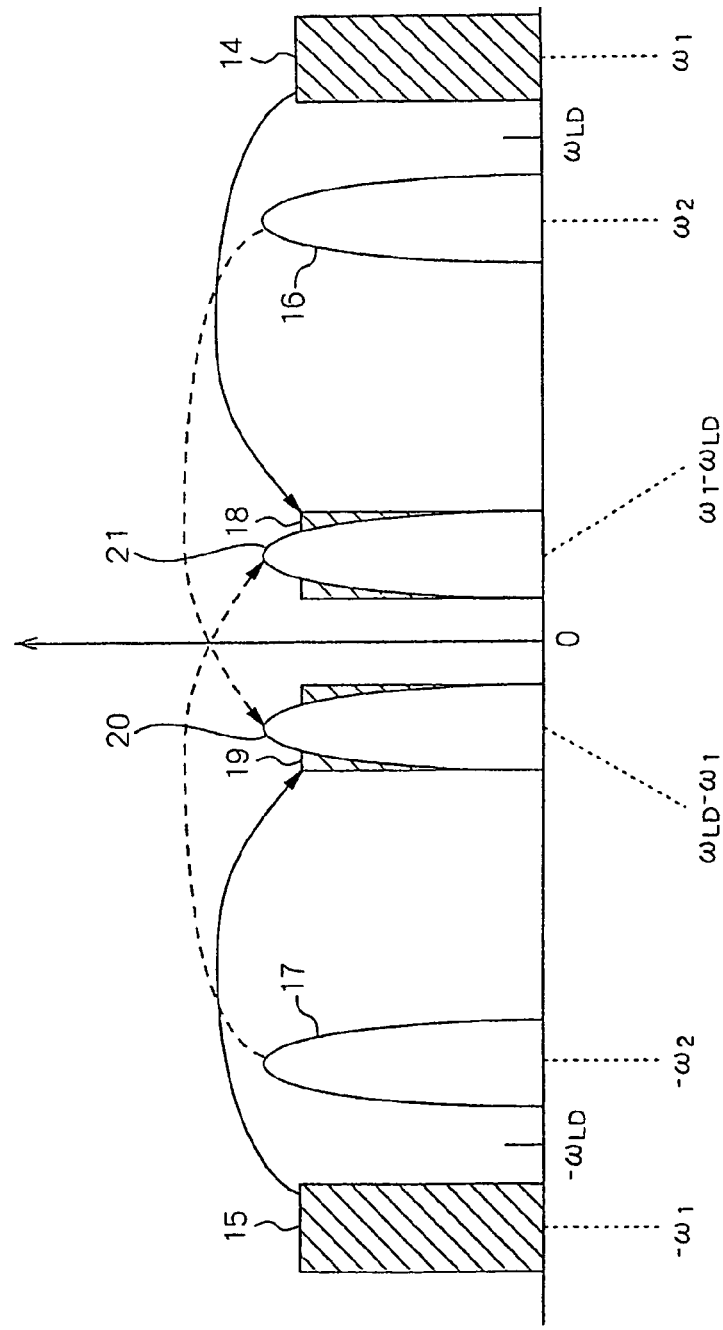
FIG. 18 is a chart showing a state of a down-conversion from the input signal to an I-signal in a mixer 2.
Figure 19:
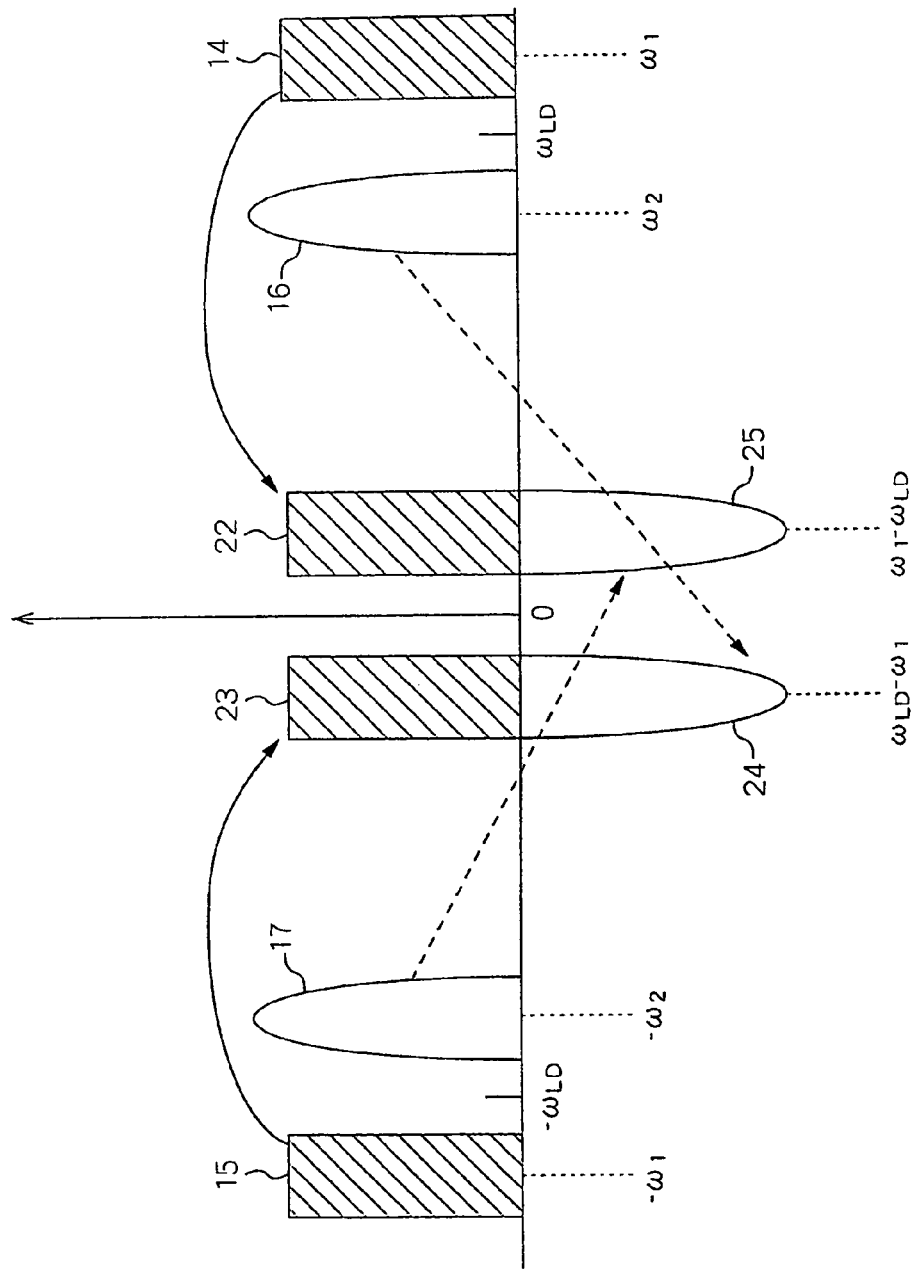
FIG. 19 is a chart showing a state of a down-conversion from the input signal to a Q-signal in a mixer 3.
Figure 20:
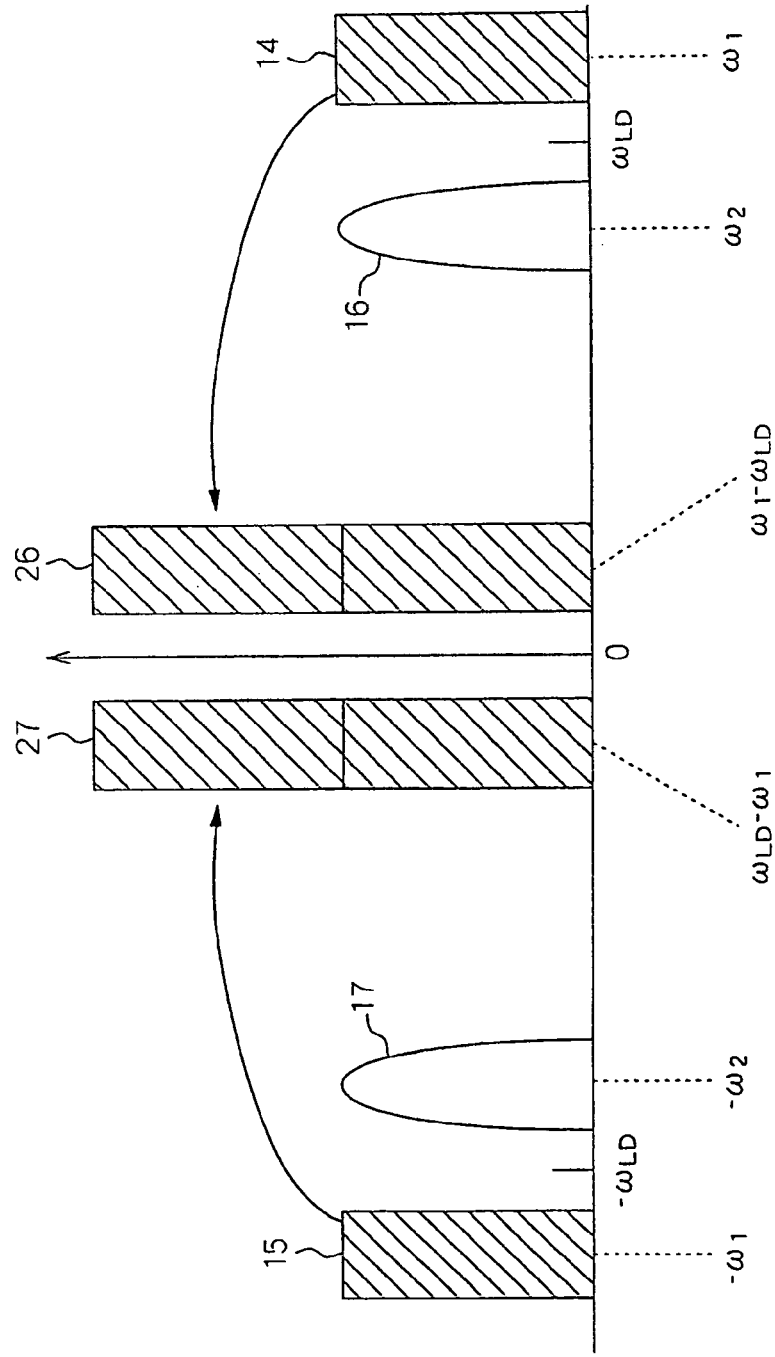
FIG. 20 is a chart showing components of a down-converted signal.
Figure 21:
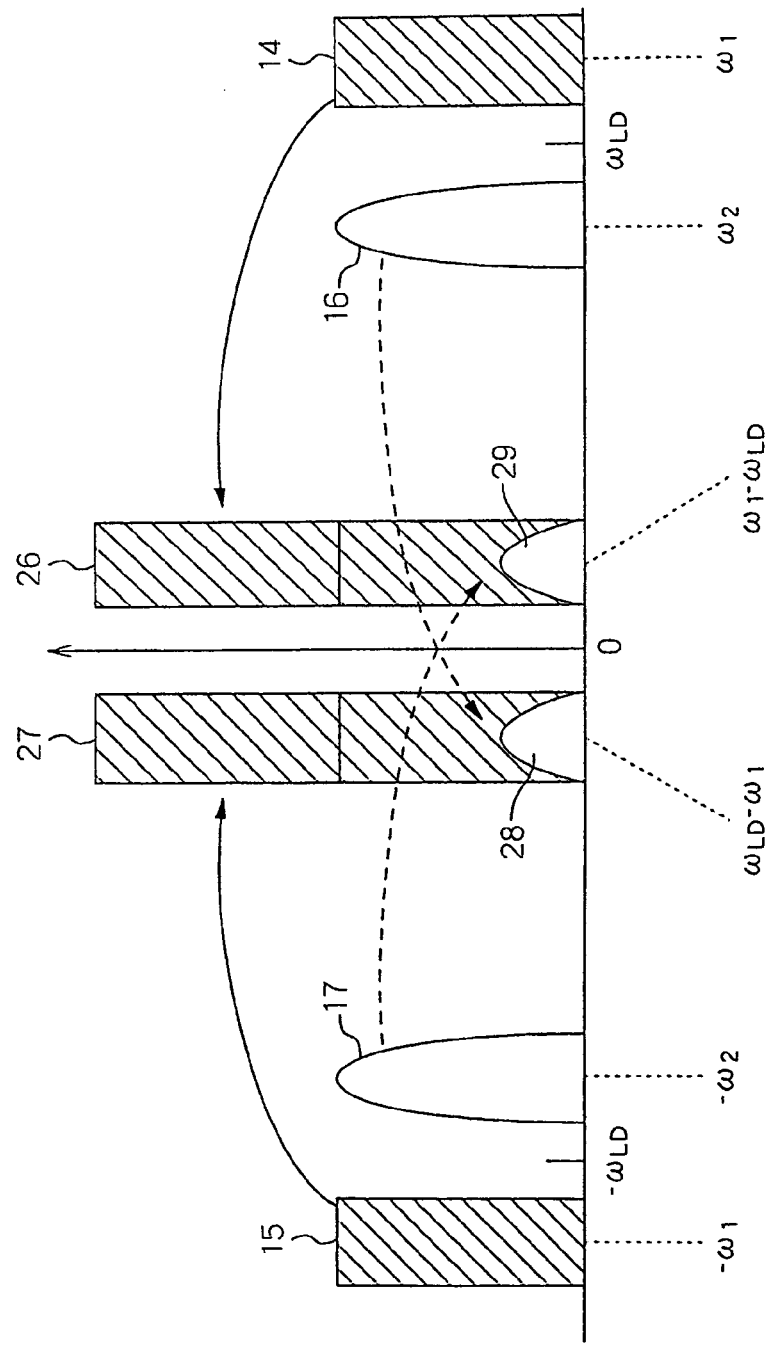
FIG. 21 is a chart showing an example which is in a state where an image signal is not completely suppressed.

Next, an eleventh embodiment of the present invention will be described. FIG. 15 is a diagram showing a digital signal processing unit including the signal processor 13 according to the present embodiment. As shown in FIG. 15, the configuration of the signal processor 13 is identical to that of the signal processor 13 shown in FIG. 13. In the present embodiment, the signal processing circuit 79 (first signal processing circuit) is connected to the output terminal 68 of the signal processor 13, and the signal processing circuit 80 (second signal processing circuit) is connected to the comparator 66 via the input terminal 82.

The signal processing circuit 79 performs demodulation and error correction processing of signal from the output terminal 68. Signal which is demodulated and error-corrected by the signal processing circuit 79 is output from the output terminal 81. The error rate detected by the signal processing circuit 79 are output from the other output terminal of the signal processing circuit 79, and input into another signal processing device 80.

The signal processing circuit 80 changes the threshold value of the comparator 66 by only a small amount at each time, and monitors the fluctuation of the error rate. The signal processing circuit 80 controls the time average value of the threshold of the comparator 66 so as to minimize the error rate. When the error rate becomes smaller than a predetermined value, the signal processing circuit 80 stops both to change the threshold value and to optimize the threshold value.

In the present embodiment, it is possible to dynamically optimize the threshold value of the comparator 66 so as to lower the error rate of the received signal by switching the switch 67 using the signal processing circuits 79, 80.

In the first to the eleventh embodiments, the second signal is assumed to be a signal output from the adder 7 and the first signal is assumed to be a signal output from the subtracter 8. However, the present invention is not limited to this configuration, and the second signal may be one output from the subtracter 8 and the first signal may be one output from the adder 7. In other words, the present invention may be so configured as to remove the image signal from the signal output from the subtracter 8 on the basis of the correlation between the respective signals and the signal output from the adder 7.

INDUSTRIAL APPLICABILITY

As described above, the present invention is so configured as to calculate an image suppression ratio, which is the ratio of an image signal to a desired signal, in a first signal in which an image signal is suppressed, and to output a signal obtained by subtracting a signal obtained by multiplexing the second signal and the image suppression ration in the first signal, in which a desired signal is suppressed by the image suppression ratio, from the first signal. Thereby, the residues of the image signal included in the second signal can be removed completely. This enables to suppress the superimposition of undesired image signal generated during signal processing on the desired signals.

Further, in the present invention, if a difference between the logarithmic value of the mean square of the first signal and the logarithmic value of the mean square of the second signal, that is, a ratio of the desired signal intensity to the image signal intensity, exceeds a predetermined value, the output of the adding means is used as output signal. In this way, it is possible to prevent a degrading in receiving characteristics for the desired wave due to the unnecessary image signal suppression process by using the same output as conventional circuit when the image signal intensity is not so strong.

What is claimed is:

1. A signal processing method comprising:
    a first frequency conversion step in which processing is performed to convert a frequency of an input signal with a first periodic signal having a predetermined frequency;
    a second frequency conversion step in which processing is performed to convert a frequency of the input signal with a second periodic signal having a predetermined frequency;
    a phase delaying step in which processing is performed to increase a phase difference between a signal converted in the first frequency conversion step and a signal converted in the second frequency conversion step by $\pi/2$; and
    an adding step in which processing is performed to output a sum signal of respective signals where the phase difference between said signals converted in the first and the second conversion steps has been increased in said phase delaying step; wherein
    the signal processing method comprises:
    a subtracting step in which processing is performed to output a subtracted signal which is a difference between said respective signals; and
    a signal processing step in which processing is performed, assuming either one signal of the sum signal or the subtracted signal is a first signal and another signal is a second signal, to remove a component of an image signal included in the second signal, using a correlation between the first signal and the second signal and using the first signal.

2. The signal processing method, as claimed in claim 1, wherein in the signal processing step,
processing is performed to calculate a first ratio which is a ratio of a low-frequency component of a correlation value between the first signal and the second signal, to a low-frequency component of a square of the first signal, and
processing is performed to calculate a subtracted value by subtracting a signal, obtained by amplifying the first signal by the first ratio, from the second signal.

3. The signal processing method, as claimed in claim 2, wherein processing is performed by setting the first ratio to a value obtained by subtracting a logarithmic value of a low-frequency component of a square of the first signal, from a logarithmic value of a low-frequency component of a multiplexed value of the first signal and the second signal.

4. The signal processing method, as claimed in claim 2, wherein processing is performed by setting the second ratio to a value obtained by subtracting a logarithm value of a low-frequency component of a square of the first signal, from a logarithmic value of a low-frequency component of a multiplexed value of a signal obtained by delaying the first signal by $\pi/2$ and the second signal.

5. The signal processing method, as claimed in claim 2, wherein in the signal processing step, processing is performed for switching to choose to output the subtracted value obtained by subtracting said amplified first signal from the second signal, or to output the second signal.

6. The signal processing method as claimed in claim 5, comprising:
a first signal processing step in which processing is performed to detect an error rate of a signal output in the processing of the signal processing step; and
a second signal processing step in which processing is performed to monitor the error rate and output a switching signal for switching processing by the signal processing step to a side where the error rate decreases.

7. The signal processing method, as claimed in claim 5, wherein
a first intensity detecting step in which processing is performed to detect an intensity of the first signal, and
a second intensity detecting step in which processing is performed to detect an intensity of the second signal are carried out, and
if a ratio of the intensity of the second signal to the intensity of the first signal exceeds a threshold value, processing is performed to output the second signal through the signal processing step.

8. The signal processing method, as claimed in claim 7, wherein processing is performed to detect an error rate of a signal output by the processing of the signal processing step to thereby monitor the error rate, and to change the threshold value so as to make the error rate minimum.

9. The signal processing method, as claimed in claim 8, wherein processing is performed by setting the threshold value to a range between −60 dB and 30 dB.

10. The signal processing method, as claimed in claim 1, wherein in the signal processing step, each of the processing is performed after a phase of the first signal is delayed by $\pi/2$.

11. The signal processing method, as claimed in claim 1, wherein in the signal processing step,
processing is performed to calculate a first ratio which is a ratio of a low-frequency component of a correlation value between the first signal and the second signal, to a low-frequency component of a square of the first signal, to amplify the first signal by the first ratio;
processing is performed to calculate a second ratio which is a ratio of a low-frequency component of a correlation between a signal obtained by delaying the first signal by $\pi/2$ and the second signal, to a low-frequency component of a square of the first signal, to amplify by the second ratio the signal obtained by delaying the first signal by $\pi/2$; and
processing is performed to calculate a subtracted value by subtracting a sum signal of said signal amplified by the first ratio and said signal amplified by the second ratio, from the second signal.

12. The signal processing method, as claimed in claim 11, wherein in the signal processing step, processing is performed for switching to choose to output the subtracted value obtained by subtracting said amplified first signal from the second signal, or to output the second signal.

13. The signal processing method as claimed in claim 12, comprising:
a first signal processing step in which processing is performed to detect an error rate of a signal output in the processing of the signal processing step; and
a second signal processing step in which processing is performed to monitor the error rate and output a switching signal for switching processing by the signal processing step to a side where the error rate decreases.

14. The signal processing method, as claimed in claim 12, wherein
a first intensity detecting step in which processing is performed to detect an intensity of the first signal, and
a second intensity detecting step in which processing is performed to detect an intensity of the second signal are carried out, and
if a ratio of the intensity of the second signal to the intensity of the first signal exceeds a threshold value, processing is performed to output the second signal through the signal processing step.

15. The signal processing method, as claimed in claim 14, wherein processing is performed to detect an error rate of a signal output by the processing of the signal processing step to thereby monitor the error rate, and to change the threshold value so as to make the error rate minimum.

16. The signal processing method, as claimed in claim 15, wherein processing is performed by setting the threshold value to a range between −60 dB and 30 dB.

17. The signal processing method, as claimed in claim 1, wherein, the first signal is converted into digital signal and the second signal is converted into digital signal, whereby the processing in the signal processing step is digitally computed.

18. The signal processing method, as claimed in claim 1, comprising, a signal component wherein an undesired frequency band is cut from the first signal, and a signal component in an undesired frequency band is cut from the second signal.

19. The signal processing method, as claimed in claim 1, wherein the second periodic signal is generated with a phase thereof being delayed by $\pi/2$ to that of the first periodic signal.

20. The signal processing method, as claimed in claim 1, wherein processing is performed by setting a phase difference between an input signal input in the first frequency conversion step and an input signal input in the second frequency conversion step, to $\pi/2$.

21. The signal processing method, as claimed in claim 1, wherein in the phase delaying step, a phase of a signal converted in the first frequency conversion step is advanced by $\alpha$, and a phase of a signal converted in the second frequency conversion step is delayed by $(\pi/2-\alpha)$.

22. The signal processing method, as claimed in claim 21, wherein $\alpha$ is set to zero or $\pi/2$.

23. A signal processing device comprising:
first frequency converter for converting a frequency of an input signal with a first periodic signal having a predetermined frequency;
second frequency converter for converting a frequency of the input signal with a second periodic signal having a predetermined frequency;
phase shifter for increasing a phase difference between a signal converted by the first frequency converter and a signal converted by the second frequency converter by $\pi/2$; and
an adder for outputting a sum signal of respective signals where the phase difference between the signals has been increased by the phase shifter; wherein
the signal processing device comprises:
a subtracter for outputting a subtracted signal which is a difference between said respective signals; and
a signal processor which, assuming either one signal of the sum signal or the subtracted signal is a first signal and another signal is a second signal, removes a component of an image signal included in the second signal, using a correlation between the first signal and the second signal and using the first signal.

24. The signal processing device, as claimed in claim 23, wherein the signal processor performs,
processing to obtain a first ratio which is a ratio of a low-frequency component of a correlation value between the first signal and the second signal, to a low-frequency component of a square of the first signal, and
processing to calculate a subtracted value by subtracting a signal obtained by amplifying the first signal by the first ratio, from the second signal.

25. The signal processing device, as claimed claim 24, wherein the first ratio is a value calculated by subtracting a logarithmic value of a low-frequency component of a square of the first signal, from a logarithmic value of a low-frequency component of a multiplied signal of the first signal and the second signal.

26. The signal processing device, as claimed in claim 24, wherein the signal processor has a switch to choose to output the subtracted value or to output the second signal.

27. The signal processing device, as claimed in claim 26, wherein the signal processor further comprises an input terminal into which a signal for switching the switch is input.

28. The signal processing device, as claimed in claim 26, wherein the signal processor comprises:
first intensity detector for detecting an intensity of the first signal; and
second intensity detector for detecting an intensity of the second signal; wherein
if a ratio of the intensity of the second signal to the intensity of the first signal exceeds a threshold value, the switch chooses to output the second signal.

29. The signal processing device, as claimed in claim 28, wherein the signal processor further comprises an input terminal into which a signal for changing the threshold value is input.

30. The signal processing device, as claimed in claim 29, further comprising:
a first signal processing circuit which detects an error rate of a signal output from the signal processor, and
a second signal processing circuit which monitors the error rate and inputs into the input terminal the signal for changing the threshold value so as to make the error rate minimum.

31. The signal processing device, as claimed in claim 28, wherein the threshold value is in a range between −60 dB and 30 dB.

32. The signal processing device, as claimed in claim 23, wherein the signal processor performs each of the processing after a phase of the first signal is delayed by $\pi/2$.

33. The signal processing device, as claimed in claim 23, wherein the signal processor performs,
processing to calculate a first ratio which is a ratio of a low-frequency component of a correlation value between the first signal and the second signal, to a low-frequency component of a square of the first signal, to amplify the first signal by the first ratio,
processing to calculate a second ratio which is a ratio of a low-frequency component of a correlation value between a signal obtained by delaying the first signal by $\pi/2$ and the second signal, to a low-frequency component of a square of the first signal, to amplify by the second ratio the signal obtained by delaying the first signal by $\pi/2$, and
processing to calculate a subtracted value by subtracting a sum signal of the signal amplified by the first ratio and the signal amplified by the second ratio, from the second signal.

34. The signal processing device, as claimed in claim 33, wherein the first ratio is a value calculated by subtracting a logarithmic value of a low-frequency component of a square of the first signal, from a logarithmic value of a low-frequency component of a multiplied signal of the first signal and the second signal.

35. The signal processing device, as claimed in claim 33, wherein the second ratio is a value calculated by subtracting a logarithmic value of a low-frequency component of a square of the first signal, from a logarithmic value of a low-frequency component of a multiplied signal of the signal obtained by delaying the first signal by $\pi/2$ and the second signal.

36. The signal processing device, as claimed in claim 33, wherein the signal processor has a switch to choose to output the subtracted value or to output the second signal.

37. The signal processing device, as claimed in claim 36, wherein the signal processor further comprises an input terminal into which a signal for switching the switch is input.

38. The signal processing device, as claimed in claim 37, further comprising:
a first signal processing circuit which detects an error rate of a signal output from the signal processor, and
a second signal processing circuit which monitors the error rate and inputs the signal for switching the switch into a side where the error rate decreases.

39. The signal processing device, as claimed in claim 36, wherein the signal processor comprises:
first intensity detector for detecting an intensity of the first signal; and
second intensity detector for detecting an intensity of the second signal; wherein if a ratio of the intensity of the second signal to the intensity of the first signal exceeds a threshold value, the switch chooses to output the second signal.

40. The signal processing device, as claimed in claim 39, wherein the signal processor further comprises an input terminal into which a signal for changing the threshold value is input.

41. The signal processing device, as claimed in claim 40, further comprising:
   a first signal processing circuit which detects an error rate of a signal output from the signal processor, and
   a second signal processing circuit which monitors the error rate and inputs into the input terminal the signal for changing the threshold value so as to make the error rate minimum.

42. The signal processing device, as claimed in claim 23, further comprising:
   a first AD converter to convert the first signal into digital signal before being input into the signal processor; and
   a second AD converter to convert the second signal into digital signal before being input into the signal processor; wherein the signal processor performs each of the processing by a digital computation.

43. The signal processing device, as claimed in claim 23, further comprising:
   a first filter for cutting a signal component in an undesired frequency band from the first signal; and
   a second filter for cutting a signal component in an undesired frequency band from the second signal.

44. The signal processing device, as claimed in claim 43, wherein the first filter and the second filter are band pass filters which pass components in a specific band.

45. The signal processing device, as claimed in claim 23, wherein the second periodical signal has a phase delayed by $\pi/2$ to a phase of the first periodical signal.

46. The signal processing device, as claimed in claim 23, further comprising, a phase shifter for setting a phase difference between an input signal input into the first frequency converter and an input signal input into the second frequency converter, to $\pi/2$.

47. The signal processing device, as claimed in claim 23, wherein the phase shifter comprises:
   a phase shifter for advancing a phase of a signal converted by the first frequency conversion means by $\alpha$; and
   a phase shifter for delaying a phase of a signal converted by the second frequency conversion means by $(\pi/2-\alpha)$.

48. The signal processing device, as claimed in claim 47, wherein $\alpha$ is zero.

49. The signal processing device, as claimed in claim 47, wherein $\alpha$ is $\pi/2$.

* * * * *